US009581899B2

(12) United States Patent
Guillorn et al.

(10) Patent No.: US 9,581,899 B2
(45) Date of Patent: Feb. 28, 2017

(54) 2-DIMENSIONAL PATTERNING EMPLOYING TONE INVERTED GRAPHOEPITAXY

(71) Applicant: International Business Machines Corporation, Armonk, NY (US)

(72) Inventors: Michael A. Guillorn, Yorktown Heights, NY (US); Kafai Lai, Poughkeepsie, NY (US); Jed W. Pitera, Portola Valley, CA (US); Hsinyu Tsai, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 1129 days.

(21) Appl. No.: 13/686,058

(22) Filed: Nov. 27, 2012

(65) Prior Publication Data

US 2016/0358776 A1     Dec. 8, 2016

(51) Int. Cl.
  *G03F 7/40*       (2006.01)
  *G03F 7/00*       (2006.01)
  (Continued)
(52) U.S. Cl.
  CPC .......... *G03F 7/0002* (2013.01); *B81B 7/0006* (2013.01); *B81C 1/00031* (2013.01); *G03F 7/0035* (2013.01); *G03F 7/165* (2013.01); *H01L 21/0337* (2013.01); *H01L 21/31144* (2013.01); *H01L 21/76816* (2013.01);
  (Continued)
(58) Field of Classification Search
  CPC ...... G03F 7/002; G03F 7/0035; G03F 7/2016; H01L 21/0271; H01L 21/31144; H01L 21/0337; H01L 21/033; B81C 1/00031; B81C 2201/0149

USPC .......... 430/322, 323, 324, 330; 216/41; 438/311, 780, 947
  See application file for complete search history.

(56) References Cited

U.S. PATENT DOCUMENTS 8,026,044 B2 *  9/2011  Lee ................... H01L 21/0337
                                           430/270.1
8,114,306 B2    2/2012  Cheng et al.
                (Continued)

OTHER PUBLICATIONS

US 8,123,962, 02/2012, Millward et al. (withdrawn)
(Continued)

*Primary Examiner* — Amanda C Walke
(74) *Attorney, Agent, or Firm* — Scully, Scott, Murphy & Presser, P.C.; Louis J. Percello, Esq.

(57) ABSTRACT

After formation of a template layer over a neutral polymer layer, a self-assembling block copolymer material is applied and self-assembled. The template layer includes a first linear portion, a second linear portion that is shorter than the first linear portion, and blocking template structures having a greater width than the second linear portion. The self-assembling block copolymer material is phase-separated into alternating lamellae in regions away from the width-wise-extending portion. The blocking template structures perturb, and cause termination of, the lamellae. A cavity parallel to the first and second linear portions and terminating in self-alignment to the blocking template structures is formed upon selective removal of a polymeric block component. The pattern of the cavity can be inverted and transferred into the material layer to form fins having different lengths.

23 Claims, 19 Drawing Sheets

(51) Int. Cl.
*H01L 21/033* (2006.01)
*H01L 21/311* (2006.01)
*B81C 1/00* (2006.01)
*H01L 21/768* (2006.01)
*B81B 7/00* (2006.01)
*G03F 7/16* (2006.01)

(52) U.S. Cl.
CPC ... *B81B 2203/0353* (2013.01); *B81B 2207/07* (2013.01); *B81C 2201/0149* (2013.01); *B81C 2201/0198* (2013.01)

(56) References Cited

U.S. PATENT DOCUMENTS

| | | |
|---|---|---|
| 8,133,534 B2 | 3/2012 | Stoykovich et al. |
| 8,173,034 B2 | 5/2012 | Millward et al. |
| 8,211,737 B2 | 7/2012 | Russell et al. |
| 8,226,838 B2 | 7/2012 | Cheng et al. |
| 8,921,030 B2 * | 12/2014 | Guillorn ............. B81C 1/00031 430/270.1 |
| 9,349,585 B2 * | 5/2016 | Nakaoka ............... G03F 1/0046 |
| 9,368,350 B1 * | 6/2016 | He ...................... H01L 21/0338 |

OTHER PUBLICATIONS

Hinsberg, W. et al., "Self-Assembling Materials for Lithographic Patterning: Overview, Status and Moving Forward" Proceedings of SPIE, Alternative Lithographic Technologies II (Feb. 21, 2010) pp. 76370G-1-76370G11, vol. 7637.

Cheng, J.Y. et al., "Simple and Versatile Methods to Integrate Directed Self-Assembly with Optical Lithography Using a Polarity-Switched Photoresist" ACS Nano (Jul. 15, 2010) pp. 4815-4823, vol. 4, No. 8.

Bencher, C. et al., "Self-Assembly Patterning for sub-15nm Half-Pitch: A Transition from Lab to Fab" SPIE Proceedings of SPIE, Alternative Lithographic Technologies III (Apr. 1, 2011) pp. 79700F-1-79700F-9, vol. 79700F.

* cited by examiner

2-DIMENSIONAL PATTERNING EMPLOYING TONE INVERTED GRAPHOEPITAXY

STATEMENT REGARDING FEDERALLY SPONSORED RESEARCH OR DEVELOPMENT

This invention was made with Government support under Contract No. FA8650-10-C-7038 awarded by Defense Advanced Research Projects Agency (DARPA). The Government has certain rights in this invention.

BACKGROUND

The present disclosure relates generally to a method of forming nanoscale structures, and more particularly to a method of forming nanoscale fin structures that are cut perpendicular to a lengthwise direction, and structures for forming the same.

Fin structures that extend along a lengthwise direction with a uniform width are useful in semiconductor manufacturing. For example, semiconductor fins can be employed to form fin field effect transistors that employ sidewalls of the semiconductor fins as channels of the transistor.

Fins can be formed by patterning a material layer such as a semiconductor material layer employing an etch mask and an anisotropic etch process. The anisotropic etch process is typically prone to a pattern factor, i.e., the local density of the patterned area. Thus, the etch bias, i.e., the lateral offset between a physical sidewall of patterned material layer and an overlying sidewall of an etch mask layer, is different across nested features and isolated features.

Thus, methods have been developed in the prior art for forming a nested array of fins and subsequently removing undesired portions of the fins employing a cut mask. However, lithographic alignment of a cut pattern generated with the cut mask with preexisting patterns is a challenge. Thus, a non-lithographic method for forming fins that are cut to a suitable length is desired.

SUMMARY

A stack including an organic planarization layer, a hard mask layer, and a neutral polymer layer is formed over a material layer. A template layer is formed over the neutral polymer layer and is patterned to include a first linear portion extending along a lengthwise direction, a second linear portion having a lesser length than the first linear portion, extending along the lengthwise direction, and having a uniform width, and blocking template structures having a greater width than the second linear portion. A self-assembling block copolymer material is applied over the neutral polymer layer, and is induced to self-assembly around the first linear portion, the second linear portion, and the blocking template structures. The first linear portion and the second linear portion induce the self-assembling block copolymer material to phase-separate into alternating lamellae including a first polymeric block component or a second polymeric block component in regions distal from the blocking template structures. In regions proximal to the blocking template structures, the blocking template structures perturb lengthwise extension of, and cause termination of, of the lamellae. A cavity parallel to the first and second linear portions and terminating in self-alignment to the widthwise-extending portion is formed upon removal of one of the first and second polymeric block components. The pattern of the cavity can be inverted and transferred into the material layer to form fins having different lengths.

According to an aspect of the present disclosure, a method of forming a patterned structure is provided. A patterned template layer is formed over a substrate. The template layer contains a first linear portion extending along a lengthwise direction and having a first length, a second linear portion that is parallel to the first linear portion and having a second length that is less than the first length and having a uniform width, and blocking template structures having a blocking template structure width that is greater than the uniform width. A block copolymer material is applied over the substrate and on the patterned template layer. Self-assembly of polymeric block components within the self-assembling block copolymer material is induced employing the patterned template layer as a template for alignment. A polymeric block component portion parallel to the first and second linear portions, having a third length that is less than the second length, and having another uniform width is formed between a pair of blocking template structures among the blocking template structures.

DETAILED DESCRIPTION

Figure 1A:
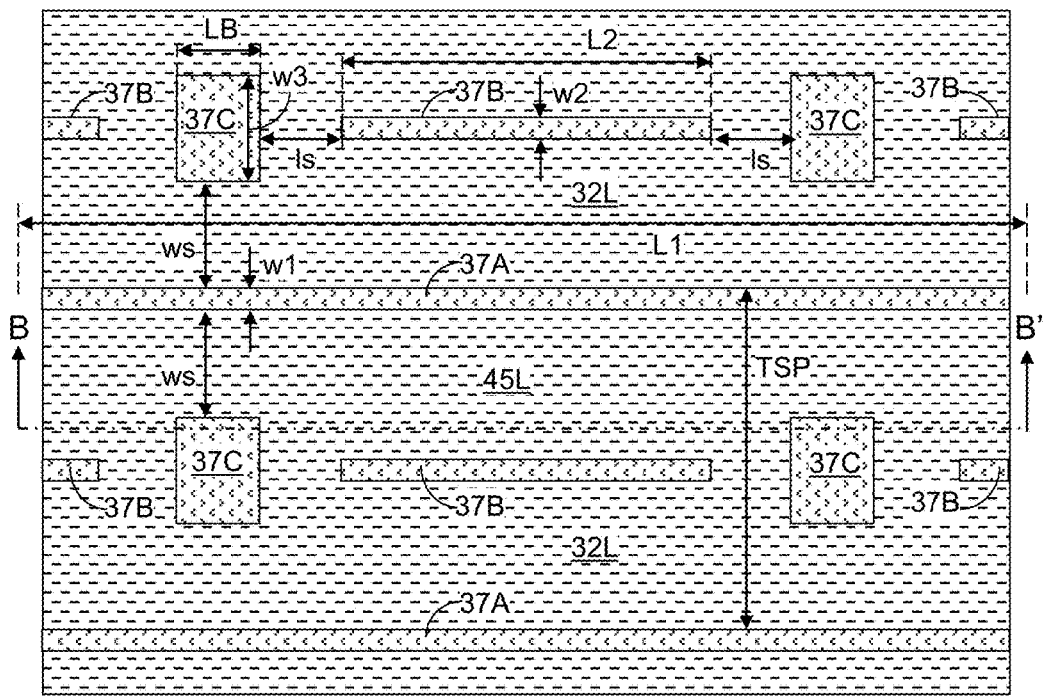
FIG. 1A is a top-down view of a first exemplary patterned structure after formation of a material stack of a first material layer, an underlying organic planarization layer (OPL), a second material layer, an organic planarization layer (OPL), a hard mask layer, a neutral polymer layer, and a patterned template layer over a substrate according to an embodiment of the present disclosure.

As stated above, the present disclosure relates to a method of forming nano scale structures, and more particularly to a method of forming nanoscale fin structures that are cut perpendicular to a lengthwise direction, and structures for forming the same. Aspects of the present disclosure are now described in detail with accompanying figures. It is noted that like and corresponding elements are referred to by like reference numerals.

Figure 1B:
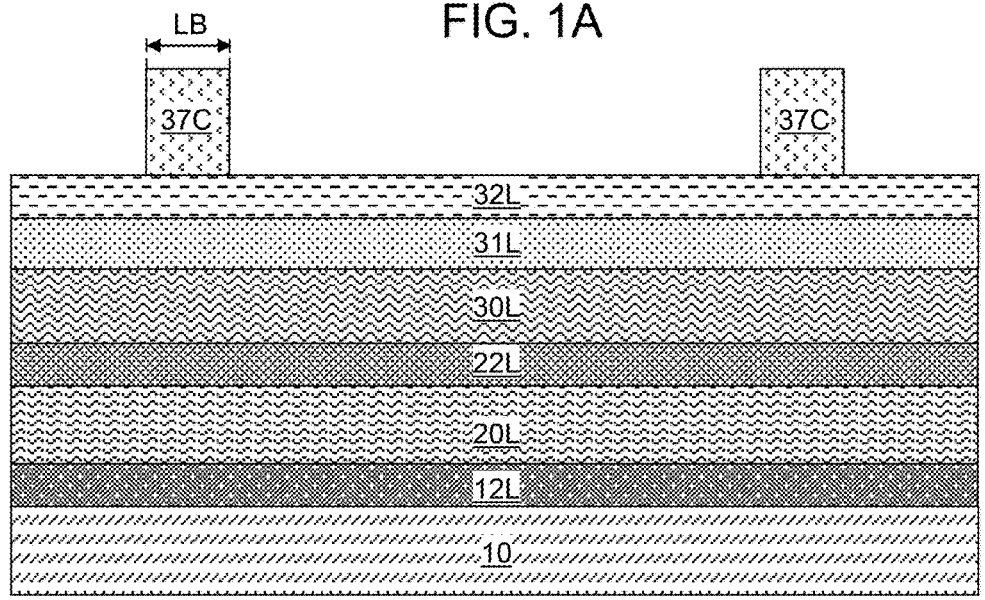
FIG. 1B is a vertical cross-sectional view of the first exemplary patterned structure along the vertical plane B-B' of FIG. 1A.

Referring to FIGS. 1A and 1B, a first exemplary patterned structure according to an embodiment of the present disclosure includes a material stack formed over a substrate 10. The material stack can include, from bottom to top, a first material layer 12L, an underlying organic planarization layer (OPL) 20L, a second material layer 22L, an organic planarization layer (OPL) 30L, a hard mask layer 31L, and a neutral polymer layer 32L. A patterned template layer (37A, 37B, 37C) is subsequently formed thereupon.

The substrate 10 can be a semiconductor substrate, a dielectric substrate, a conductive material substrate, or a combination thereof. In one embodiment, the substrate 10 can include a bulk semiconductor substrate or a semiconductor-on-insulator (SOI) substrate as known in the art. The substrate 10 can optionally include a metal interconnect structure including at least one dielectric material layer and metal lines and/or metal via structures embedded therein. The top surface of the substrate 10 can be planar, or can have a non-planar topography.

The first material layer 12L can be a permanent material layer that is intended to remain at the end of a sequence of processing steps, or a temporary material layer that is intended to be removed after the sequence of processing steps. In one embodiment, the first material layer 12L can be a conductive material layer, a dielectric material layer, a semiconductor material layer, or a stack thereof. In one embodiment, the first material layer 12L can be a dielectric hard mask layer such as a silicon nitride layer or a silicon oxide layer. The thickness of the first material layer 12L can be from 5 nm to 100 nm, although lesser and greater thicknesses can also be employed. The top surface of the first material layer 12L can be planar, or can have a non-planar topography.

The underlying OPL 20L includes a self-planarizing material. As used herein, a self-planarizing material is a material that flows at the standard ambient temperature and pressure (SATP), i.e., 20° C. (293.15 K, 68° F.) and an absolute pressure of 101.325 kPa (14.696 psi, 1 atm), to provide a planar top surface. In one embodiment, the self-planarizing material of the underlying OPL 20L can be an organic material including C, O, and H, and optionally including Si and/or F. The formulation of the underlying OPL 20L can be selected to provide sufficiently low viscosity so that a top surface of the OPL is self-planarizing over underlying topographic features. In one embodiment, the self-planarizing material of the underlying OPL 20L can be an amorphous carbon layer. The thickness of the underlying OPL 20L can be from 10 nm to 300 nm, although lesser and greater thicknesses can also be employed.

The second material layer 22L can be a conductive material layer, a dielectric material layer, a semiconductor material layer, or a stack thereof. In one embodiment, the second material layer 22L can be a dielectric hard mask layer such as a silicon nitride layer or a silicon oxide layer. The thickness of the second material layer 22L can be from 5 nm to 100 nm, although lesser and greater thicknesses can also be employed. The top surface of the second material layer 22L is planar due to the planarity of the top surface of the underlying OPL 20.

The OPL 30L includes a self-planarizing material, which can be selected from any of the self-planarizing material that can be employed for the underlying OPL 20L. The self-planarizing material of the OPL 30L can be the same as, or can be different from, the self-planarizing material of the underlying OPL 20L. In one embodiment, the self-planarizing material of the underlying OPL 30L can be an organic material including C, O, and H, and optionally including Si and/or F. In another embodiment, the self-planarizing material of the OPL 30 can be an amorphous carbon layer. The thickness of the OPL 30L can be from 10 nm to 300 nm, although lesser and greater thicknesses can also be employed.

The hard mask layer 31L is formed on top of the OPL 30L. The hard mask layer 31L includes a hard mask material such as silicon oxide, silicon nitride, silicon oxynitride, or combinations thereof. The hard mask layer 31L can be formed, for example, by chemical vapor deposition (CVD), atomic layer deposition (ALD), or spin-coating. The thickness of the hard mask layer 31L can be from 1 nm to 20 nm, although lesser and greater thicknesses can also be formed. The hard mask layer 31L can be employed to reduce structural or compositional damage to the OPL 30L during removal of polymer blocks at a subsequent processing step.

The neutral polymer layer 32L is formed on top of the hard mask layer 31L. The neutral polymer layer 32L can include, for example, an antireflective coating material and/or a thin dielectric material (such as silicon oxide or silicon nitride) having a thickness from 2 nm to 20 nm, although lesser and greater thicknesses can also be employed. The neutral polymer layer 32L typically has a thickness from 1 nm to 4 nm, although lesser and greater thicknesses can also be employed. In one embodiment, the neutral polymer layer 32L includes a material having substantially the same affinity to two different polymeric block components within a copolymer layer to be subsequently applied thereupon.

In one embodiment, the neutral polymer layer 32L includes a material that is neutral to, i.e., having a same affinity to, a first polymeric block component and a second polymeric block component of a block copolymer material to be subsequently applied thereupon. Without such neutrality, the domains of the component polymer blocks tend to lay parallel from the top surface of the neutral polymer layer 32L.

The patterned template layer (37A, 37B, 37C) is a pattern-including template layer that includes a set of protruding structures. In one embodiment, the patterned template layer (37A, 37B, 37C) can be a patterned photoresist layer. In this case, the patterned template layer (37A, 37B, 37C) can be formed by forming a blanket photoresist layer over the neutral polymer layer 32L, and by lithographically exposing and developing the blanket photoresist layer to form a patterned photoresist layer. For example, the patterned template layer (37A, 37B, 37C) can include hydrogen silsesquioxane (HSQ) or methyl silsesquioxane (MSQ).

In one embodiment, the pattern template layer (37A, 37B, 37C) can be formed by depositing a blanket dielectric material layer, applying a photoresist layer (not shown) thereupon, lithographically patterning the photoresist layer, and transferring the pattern of the photoresist layer into the blanket dielectric material layer. After the blanket dielectric material layer is patterned to become the patterned template layer (37A, 37B, 37C), the photoresist layer can be removed selective to the patterned template layer, for example, by ashing.

In one embodiment, the material of the patterned template layer (37A, 37B, 37C) can be selected such that the material of the patterned template layer (37A, 37B, 37C) has a greater chemical affinity to one polymer material than to another polymer material in a self-aligning copolymer material to be subsequently employed. The thickness of the patterned template layer (37A, 37B, 37C) can be from 10 nm to 300 nm, although lesser and greater thicknesses can also be employed.

The patterned template layer (37A, 37B, 37C) includes at least one first linear portion 37A, at least one second linear portion 37B, and blocking template structures 37C. Each of the at least one first linear portion 37A extends along a lengthwise direction. The edges of the at least one first linear portion 37A that are parallel to the lengthwise direction are herein referred to as lengthwise edges of the at least one first linear portion 37A. Each of the at least one first linear portion 37A can have a uniform width in a horizontal direction perpendicular to the lengthwise direction, which is herein referred to as a first width w1. As used herein, a width is "uniform" if the width is invariant under translation along a horizontal direction perpendicular to the direction along which the width is measured. One or more of the at least one first linear portion 37A can have a first length L1, which is the extent of a corresponding first linear portion 37A along the lengthwise direction. The first length L1 can be, for example, in a range from 150 nm to 1 mm.

Each of the at least one second linear portion 37B extends along the lengthwise direction of the at least one first linear portion 37A. The edges of the at least one second linear portion 37B that are parallel to the lengthwise direction of the at least one second linear portion 37B are herein referred to as lengthwise edges of the at least one second linear portion 37B. Each of the at least one second linear portion 37B can have a uniform width in a horizontal direction perpendicular to the lengthwise direction of the at least one second linear portion 37B, which is herein referred to as a second width w2. One or more of the at least one second linear portion 37B can have a second length L2, which is the extent of a corresponding second linear portion 37B along the lengthwise direction the at least one second linear portion 37B that is parallel to the lengthwise direction of the at least one first linear portion 37A. Thus, each of the at least one second linear portion 37B is parallel to the at least one first linear portion 37A, i.e., the lengthwise edges of the at least one second linear portion 37B are parallel to the lengthwise edges of the at least one second linear portion 37A.

The second length L2 is less than the first length L1. The second length L2 can be in a range from 50 nm to 1,000 nm, although lesser and greater dimensions can also be employed.

In one embodiment, the first length L1 can be greater than twice the second length. In one embodiment, the first width w1 can be substantially the same as the second width w2. As used herein, a first dimension is substantially the same as a second dimension if the difference between the two dimensions is less than the sum of inherent variations in the first dimension due to surface roughness and the inherent variations in the second dimension due to surface roughness. Typically, the surface roughness of the at least one first linear portion 37A and the surface roughness of the at least one second linear portion 37B are about 2 nm, respectively.

The blocking template structures 37C can have a substantially rectangular shape, which has a length along the lengthwise direction of the at least one second linear portion 37B and has a width along a horizontal direction that is perpendicular to the lengthwise direction of the at least one second linear portion 37B. As used herein, an object has a substantially rectangular shape if the horizontal cross-sectional areas of the object are substantially rectangular irrespective of the height of the horizontal cross-section. As used herein, a shape is substantially rectangular if a rectangle having four sides exists such that more than 80% of the sides of the rectangle coincide with the periphery of the shape, and more than 80% of the periphery of the shape coincides with the sides of the rectangle.

The blocking template structures 37C can have substantially identical shapes. As used herein, objects have substantially identical shapes if the differences in the shapes of the objects is less than twice the variations due to surface roughness of the objects. Typically, the surface roughness of the blocking template structures 37C is about 2 nm. If the blocking template structures 37C have substantially identical shapes, the length of each blocking template structure along the lengthwise direction of the at least one first linear portion 37A and the at least one second linear portion 37B is herein referred to as a blocking template structure length, or a blocking template structure length LB. The blocking template structure length LB can be, for example, in a range from 32 nm to 200 nm. If the blocking template structures 37C have substantially identical shapes, the width of each blocking template structure along the widthwise direction of the at least one first linear portion 37A and the at least one second linear portion 37B (i.e., the horizontal direction that is perpendicular to the lengthwise direction) is herein referred to as a blocking template structure width, or a third width w3. The third width w3 can be, for example, in a range from 32 nm to 600 nm. The portions of the top surface of the neutral polymer layer 32L that are not covered by the patterned template layer (37A, 37B, 37C) are physically exposed.

The various dimensions of the at least one first linear portion 37A, the at least one second linear portion 37B, and the blocking template structures 37C can be selected to facilitate self-alignment of a block copolymer material to be applied on the neutral polymer layer 32L in a manner that forms lamellae extending along the lengthwise direction (of at least one first linear portion 37A and the at least one second linear portion 37B) and terminated between a neighboring pair of blocking template structures 37C that are laterally spaced along the lengthwise direction.

In one embodiment, the block copolymer material to be subsequently applied includes alternating chains of a first polymeric block and a second polymeric block. The first polymeric block can include a chain of a first polymeric block component, and the second polymeric block can include a chain of a second polymeric block component. The first polymeric block component is a monomer that forms a first polymeric block upon polymerization. The second polymeric block component is a monomer that forms a second polymeric block upon polymerization.

In one embodiment, the second width w2 can be substantially the same as a total length of the first polymeric block. The blocking template structure width, i.e., the third width w3, can be greater than the pitch of the block copolymer material. The pitch refers to the periodicity within the copolymer material, and is equal to the sum of the total length of a single first polymeric block and the total length of a single second polymeric block.

In one embodiment, the at least one first linear portion 37A and the at least one second linear portion 37B can be a plurality of first linear portions 37A and a plurality of second linear portions 37B. The plurality of first linear portions 37A and the plurality of second linear portions 37B, and the blocking template structures 37C can be formed as a one-dimensional periodic array having a periodicity along the lengthwise direction and/or having a periodicity along the widthwise direction. The plurality of first linear portions 37A and the plurality of second linear portions 37B, and the blocking template structures 37C can be formed as a two-dimensional periodic array having a first periodicity along the lengthwise direction and having a second periodicity along the widthwise direction.

In one embodiment, a first linear portion 37A and a second linear portion 37B that is most proximate to the first linear portion 37A among the plurality of second linear portions 37B can be formed with a widthwise-direction spacing from each other that is greater than the pitch of the block copolymer material. In this case, the center-to-center distance between the first linear portion 37A and the second linear portion 37B in a direction perpendicular to the lengthwise direction can be an integer multiple of the pitch. In one embodiment, the integer is greater than 1 and is less than 11.

Further, each blocking template structure 37C can be spaced from a second linear portion 37B that is most proximate to the blocking template structure 37C with a lengthwise-direction spacing ls that is greater than the pitch.

In one embodiment, the lengthwise-direction spacing ls can be the sum of the pitch and the total length of a single second polymeric block.

In addition, each blocking template structure 37C can be spaced from a first linear portion 37A that is most proximate to the blocking template structure 37C with a widthwise-direction spacing ws that is greater than the pitch. In one embodiment, the widthwise-direction spacing ws can be the sum of the total length of a single second polymeric block and an integer multiple of the pitch. In an illustrative embodiment, this integer multiple of the pitch can be twice the pitch.

The blocking template structure width, i.e., the third width w3, can be greater than the pitch of the block copolymer material. In one embodiment, the blocking template structure width can be the sum of the total length of the first polymeric block and an integer multiple of the pitch. In an illustrative embodiment, this integer multiple of the pitch can be twice the pitch.

Figure 2A:
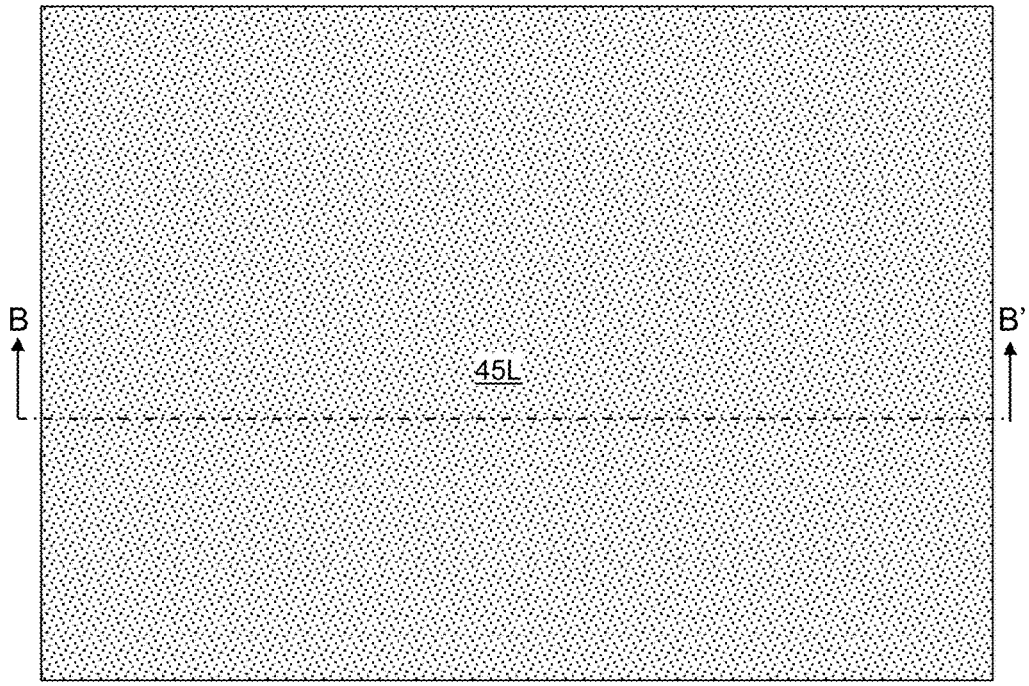
FIG. 2A is a top-down view of the first exemplary patterned structure after application of a copolymer layer according to an embodiment of the present disclosure.
Figure 2B:
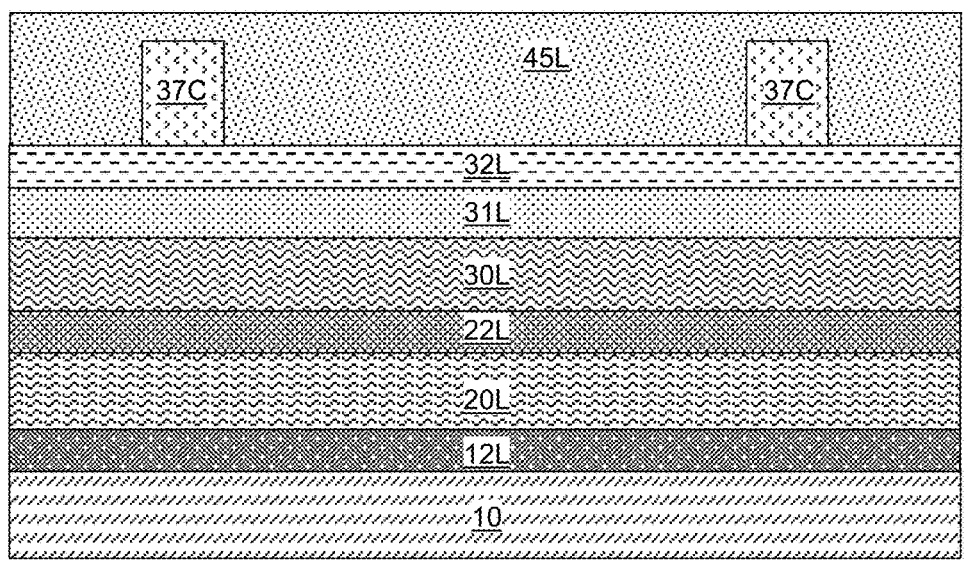
FIG. 2B is a vertical cross-sectional view of the first exemplary patterned structure along the vertical plane B-B' of FIG. 2A.

Referring to FIGS. 2A and 2B, a block copolymer material is applied over the neutral polymer layer 32L and over the top surface of the patterned template layer (37A, 37B, 37C) to form a copolymer layer 45L. The block copolymer material can be applied, for example, by spin coating. The block copolymer material comprises a first polymeric block component and a second polymeric block component that are immiscible with each other. The copolymer material may be self-planarizing. Alternatively, the block copolymer material may be planarized by chemical mechanical planarization, a recess etch, or a combination thereof. The copolymer material is applied and planarized so that the topmost surface of the copolymer material is above the topmost surface of the patterned template layer (37A, 37B, 37C). The copolymer material includes self-assembling block copolymers that are capable of self-organizing into nanometer-scale patterns.

The copolymer layer 45L can include a first polymer material, i.e., a first polymeric block component, and a second polymer material, i.e., a second polymeric block component. The block copolymer material includes alternating chains of the first polymeric block and the second polymeric block. Each first polymeric block includes a chain of a first polymeric block component, and each second polymeric block includes a chain of a second polymeric block component. The first polymeric block component and the second polymeric block component are selected such that a self-aligned assembly of first polymer blocks including the first polymeric block component and second polymer blocks including the second polymeric block component can be subsequently formed upon phase separation of the first and second polymeric block components.

Exemplary materials for the first polymeric block component and the second polymeric block component are described in U.S. Pat. No. 7,605,081 to Yang et al., issued on Oct. 20, 2009, the contents of which are incorporated herein by reference. Specific examples of self-assembling block copolymers may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

The self-assembling block copolymers are first dissolved in a suitable solvent system to form a block copolymer solution, which is then applied into the at least one trench and over the top surface of the patterned template layer (37A, 37B, 37C) to form the polymer layer 45L. The solvent system used for dissolving the block copolymer and forming the block copolymer solution may include any suitable solvent, which can include, but is not limited to: toluene, propylene glycol monomethyl ether acetate (PGMEA), propylene glycol monomethyl ether (PGME), and acetone. The copolymer material is not a conventional photoresist that may be developed upon exposure to ultraviolet light or optical light. Also, the copolymer layer 45L is not a conventional low-k dielectric material.

Figure 3A:
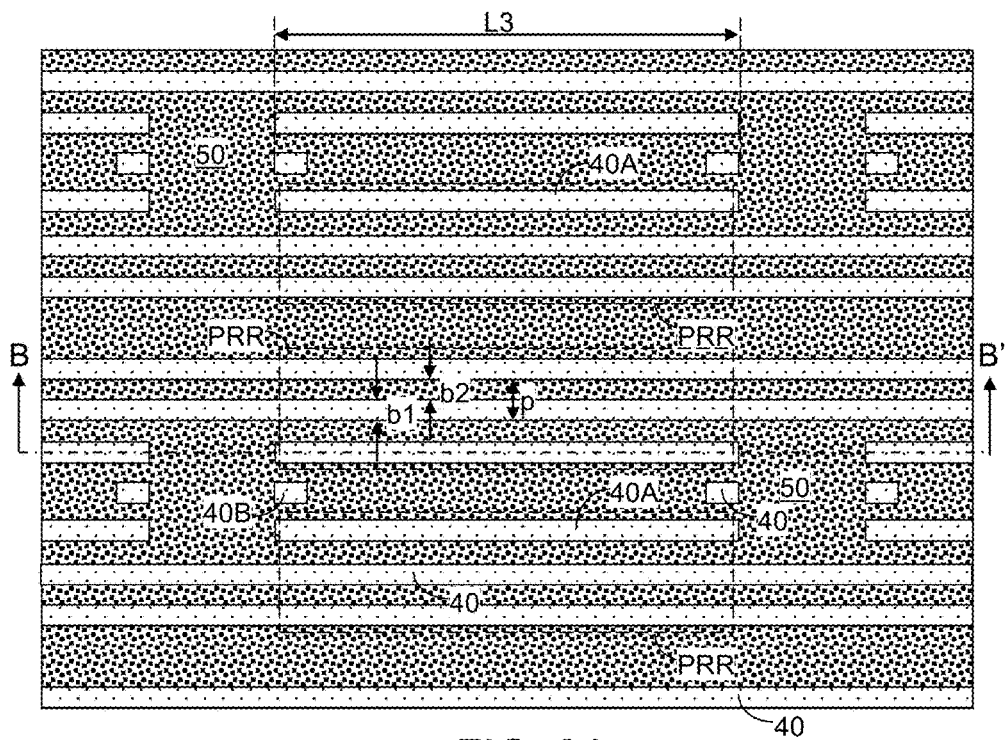
FIG. 3A is a top-down view of the first exemplary patterned structure after phase separation of the copolymer material in the copolymer layer according to an embodiment of the present disclosure.
Figure 3B:
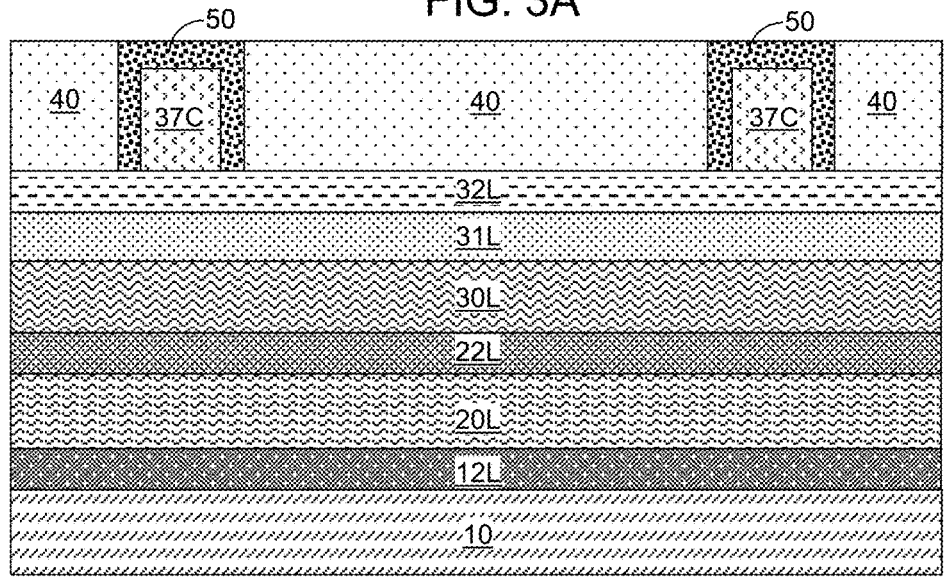
FIG. 3B is a vertical cross-sectional view of the first exemplary patterned structure along the vertical plane B-B' of FIG. 3A.

Referring to FIGS. 3A and 3B, self-assembly of polymeric block components is induced within the self-assembling block copolymer material employing the patterned template layer (37A, 37B, 37C) as a template for alignment. A nanoscale self-assembled self-aligned structure is formed in self-alignment with the patterned template layer (37A, 37B, 37C) through phase separation of the self-assembling block copolymers through annealing. The nanoscale self-assembled self-aligned structure is self-aligned to the vertical sidewalls of the patterned template layer (37A, 37B, 37C), and is herein referred to as a "self-aligned assembly." In one embodiment, the copolymer layer 45L is annealed by ultraviolet treatment or by thermal annealing at an elevated temperature to form first polymer structures 40 including the first polymeric block component and second polymer structures 50 including the second polymeric block component. The anneal may be performed, for example, at a temperature from about 200° C. to about 300° C. for a duration from 30 seconds to about 10 hours.

The composition and wetting properties of the copolymer layer 45L can be adjusted such that either some of the first polymer structures 40 or some of the second polymer structures 50 wet the sidewalls and the top surface of the patterned template layer (37A, 37B, 37C). In one embodiment, the patterned template layer (37A, 37B, 37C) can include a material having a greater chemical affinity to the second polymeric block component than to the first polymeric block component. In this case, the composition and wetting properties of the copolymer layer 45L can be adjusted such that some of the second polymer structures 50 wet the sidewalls and the top surface of the patterned template layer (37A, 37B, 37C).

Each of the first polymer structures 40 can consist essentially of the first polymeric block component, and each of the second polymer structures 50 can consist essentially of the second polymeric block component. Each of the first polymer structures 40 can have a first uniform width between the bottommost surface of the self-aligned assembly (40, 50) and the topmost surface of the self-aligned assembly (40, 50). Each of the second polymer structures 50 in contact with the neutral polymer layer 32L can have a first uniform width between the bottommost surface of the self-aligned assembly (40, 50) and the topmost surface of the self-aligned assembly (40, 50).

Portions of the first polymer structures 40 and portions of the second polymer structures 50 are arranged along the widthwise direction such that the portions of the first polymer structures 40 and the portions of the second polymer structures 50 are repeated with the same periodicity along the widthwise direction as the pitch of the block copolymer material. The portions of the first polymer structures 40 can have the same uniform width as the total length of a single first polymeric block including a chain of the first polymeric block component. The uniform width of such portions of the first polymer structures 40 is herein referred to as a first block length b1. The portions of the second polymer structures 50 can have the same uniform width as the total length of a single second polymeric block including a chain of the second polymeric block component. The uniform width of such portions of the second polymer structures 50 is herein referred to as a second block length b2. The sum of the first block length b1 ad the second block length b2 can be the same as the pitch p of the block copolymer material, i.e., the sum of the total chain length of a single first polymeric block and the total chain length of a single second polymeric block.

In one embodiment, the first block length b1 can be in a range from 3 nm to 25 nm, and the second block length b2 can be in a range from 3 nm to 25 nm. In one embodiment, the sum of the first block length b1 and the second block length b2, i.e., the pitch p, can be in a range from 6 nm to 50 nm.

The chemical composition of the copolymer layer 45L is such that the immiscibility of the first and second polymeric block components enable self assembly of the first polymeric block component into primary lamellar structures of the first polymer structures 40 and the second polymeric block component assembles into complementary lamellar structures of the second polymer structures 50. The first polymer structures 40 constitute the primary lamellar structures including the first polymeric block component, and the second polymer structures 50 constitute the complementary lamellar structures including the second polymeric block component.

At least one polymeric block component portion that is parallel to the at least one first linear portion 37A and the at least one second linear portion 37B and having a third length L3 is formed. The third length L3 is greater than the second length L2, and is less than the sum of the second length L2 and twice the lengthwise direction spacing ls. In one embodiment, the third length can be equal to the sum of the second length and twice the lengthwise spacing ls less twice the second block length b2, i.e., L3=L2+2×ls−2×b2.

In one embodiment, the at least one polymeric block component portion that is parallel to the at least one first linear portion 37A and the at least one second linear portion 37B and having a third length L3 can be one of the first polymer structures 40 as illustrated in FIG. 3A. Such first polymer structures 40 having the third length L3 are herein referred to as a truncated first polymer structure 40A, which is a type of the first polymer structures 40. Each truncated first polymer structure 40A includes the first polymeric block component, and is laterally surrounded by the second polymeric block component.

While the present disclosure is described employing an embodiment in which the at least one polymeric block component portion having the third length L3 is a first polymer structure 40, embodiments are expressly contemplated herein in which the labeling of the first polymer structures 40 and the second polymer structures are reversed. Thus, the present disclosure encompasses all embodiment in which at least one polymeric block component portion that is parallel to the at least one first linear portion 37A and the at least one second linear portion 37B and having a third length L3 is formed as a first polymer structure 40 or as a second polymer structure 50.

In a Cartesian coordinate system employing the lengthwise direction as an x-axis and the widthwise direction as an y-axis, for each truncated first polymer structure 40A, a region having an x-coordinate value between the minimum value and the maximum value for the x-coordinates of the truncated first polymer structure 40A can be defined. This region is herein referred to as a one-dimensional periodic repetition region PRR. In each periodic repetition region, the first polymer structures 40 and the second polymer structures 50 alternate with periodicity in the widthwise direction, i.e., the horizontal direction perpendicular to the lengthwise direction.

In one embodiment, some second polymer structure 50 can wet the sidewalls and the top surface of a portion of the patterned template layer (37A, 37B, 37C). Each first polymer structure 40 can be laterally spaced from the various portion of the patterned template layer (37A, 37B, 37C) by at least one second polymer bock 50.

In one embodiment, the first polymeric block component can be polystyrene, and the second polymeric block component can be poly(methyl methacrylate) (PMMA). In an illustrative example, the sum of the first block length b1 and the second block length b2 can be about 28 nm.

In one embodiment, the second width w2 of the at least one second linear portion 37B of the patterned template layer (37A, 37B, 37C) can be substantially the same as the first block length b1, which is the total length of a single first polymeric block in a molecule of the block copolymer material. Further, the width of each truncated first polymer structure 40A can be the first block length b1.

An isolated first polymer structure 40B may be formed between each neighboring pair of a second linear portion 37B and a blocking template structure 37C. Each isolated first polymer structure 40B is a type of a first polymer structure 40, and has a length along the lengthwise direction that is less than the lengthwise spacing ls. In one embodiment, the length of an isolated first polymer structure 40B may be substantially the same as the lengthwise spacing ls less twice the second block length b2, i.e., ls−2×b2. In one embodiment, the width of each isolated first polymer structure 40B may be substantially the same as the first block length b1.

Figure 4A:
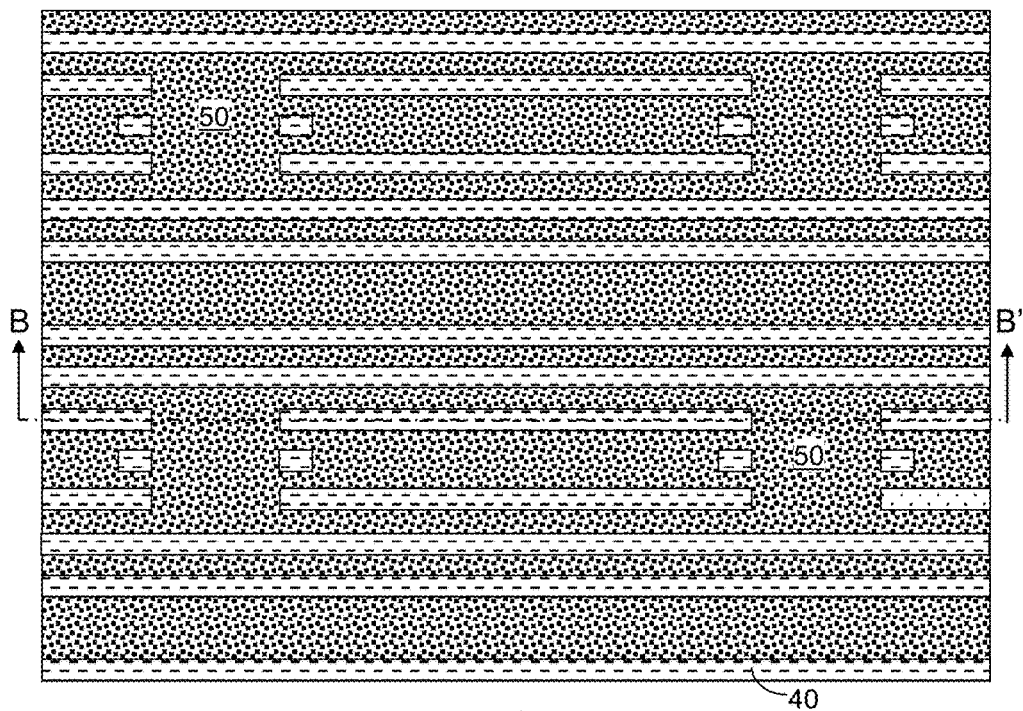
FIG. 4A is a top-down view of the first exemplary patterned structure after removal of first polymer blocks selective to second polymer blocks and formation of a first pattern including the second polymer blocks according to an embodiment of the present disclosure.
Figure 4B:
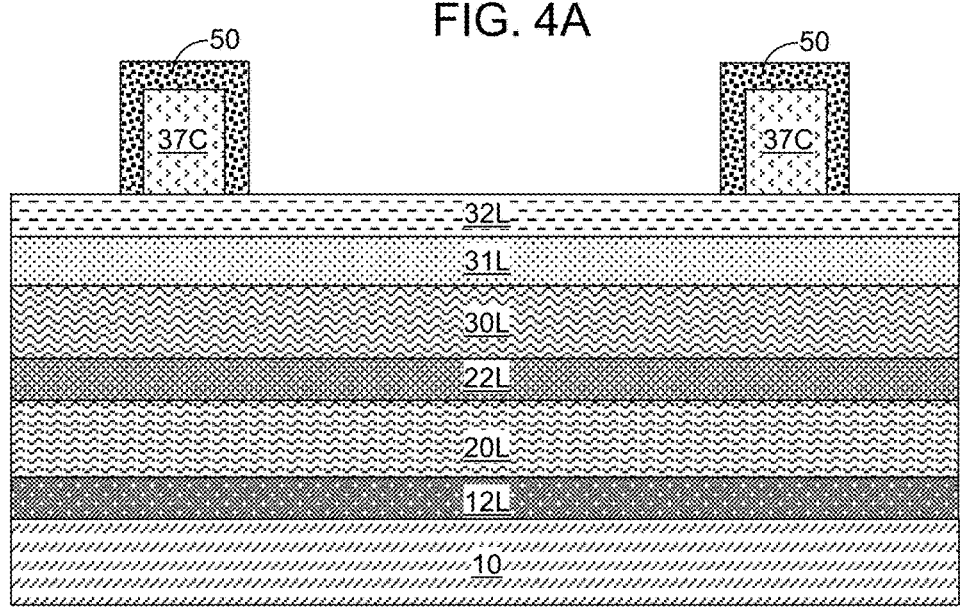
FIG. 4B is a vertical cross-sectional view of the first exemplary patterned structure along the vertical plane B-B' of FIG. 4A.

Referring to FIGS. 4A and 4B, first polymer blocks including the first polymeric block component are removed selective to second polymer blocks including the second polymeric block component. Specifically, the first polymer structures 40 including the first polymer blocks are removed selective to the second polymer structures 50 including the second polymer blocks. The removal of the first polymer structures 40 can be performed, for example, by an anisotropic etch that removes the first polymeric block component selective to the second polymeric block component.

A first pattern including the second polymer structures 50 is formed over the neutral polymer layer 32L. Trenches are formed among the second polymer structures 50. The area of the trench is the area from which the first polymer structures 40 are removed and the top surface of the neutral polymer layer 32L is physically exposed. In other words, the trench pattern is defined by the trenches embedded within the second polymeric block component. As such, the first pattern defined by the trenches among the second polymer structures 50 is a trench pattern.

Figure 5A:
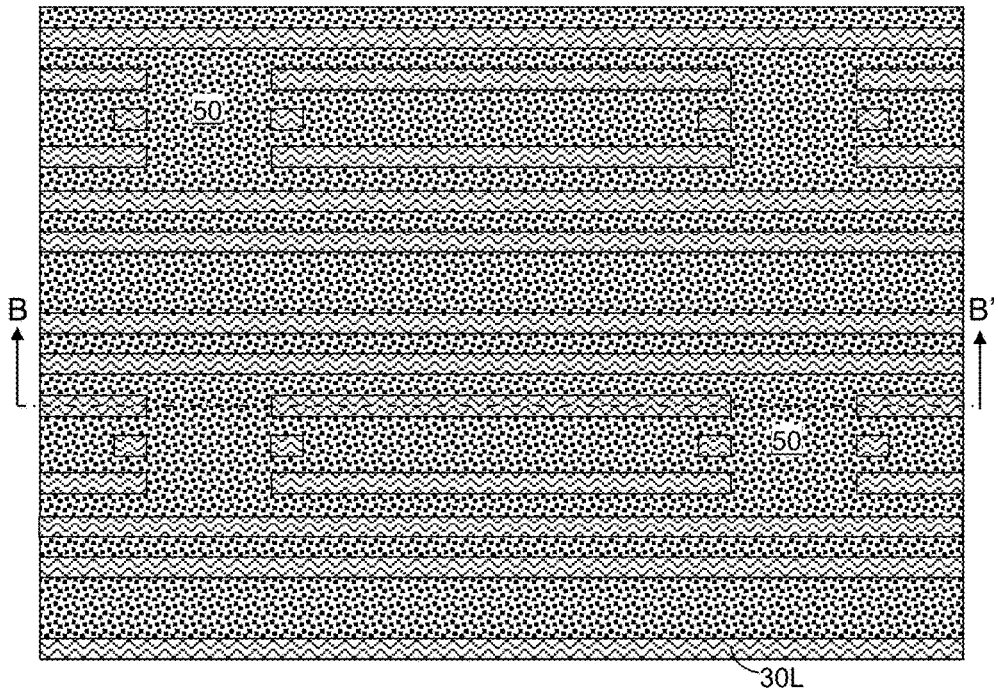
FIG. 5A is a top-down view of the first exemplary patterned structure after etching the neutral polymer layer and the hard mask layer employing the second polymer blocks as an etch mask according to an embodiment of the present disclosure.
Figure 5B:
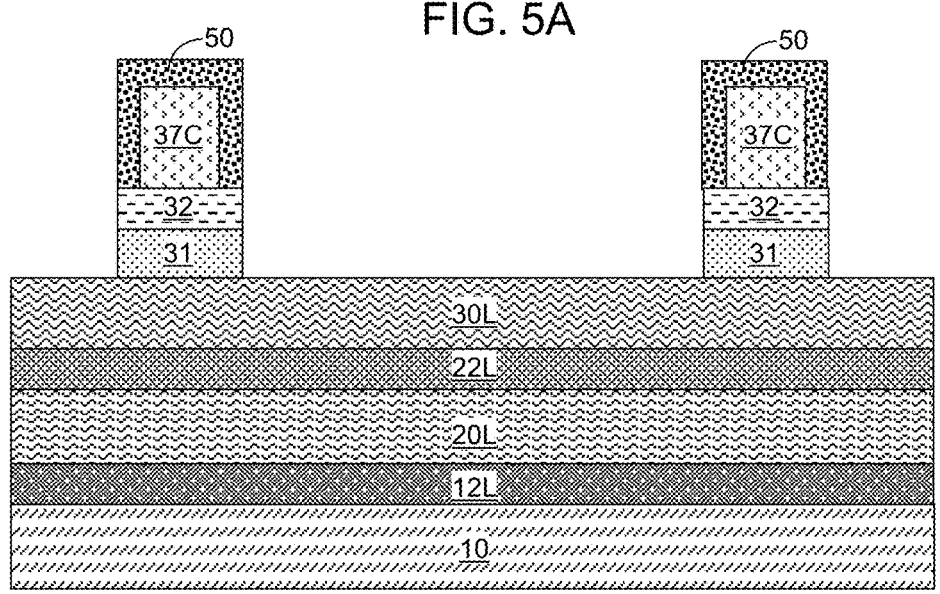
FIG. 5B is a vertical cross-sectional view of the first exemplary patterned structure along the vertical plane B-B' of FIG. 5A.

Referring to FIGS. 5A and 5B, the trench pattern is transferred into an upper portion of the material stack (12L, 20L, 22L, 30L, 31L, 32L) by an anisotropic etch employing the second polymeric block component, i.e., the second polymer structures 50, as an etch mask. Specifically, the trench pattern is transferred into the neutral polymer layer 32L and the hard mask layer 31L by an anisotropic etch that employs the second polymer structures 50, and optionally the patterned template layer (37A, 37B, 37C), as an etch mask.

The etching of the physically exposed portions of the neutral polymer layer 32L may, or may not, be selective to the second polymer structures 50 and/or the patterned template layer (37A, 37B, 37C). The chemistry of the anisotropic etch can be selected so that the materials of the hard mask layer 31L are etched, while the material(s) of the etch mask is/are not significantly etched. In one embodiment, the combination of the second polymer structures 50 and the patterned template layer (37A, 37B, 37C) can be employed as an etch mask. In another embodiment, the second polymer structures 50 alone can be employed as an etch mask. The physically exposed portions of the hard mask layer 31L are etched through until the OPL 30 is physically exposed. The pattern defined by the combination of the second polymer structures 50 and the patterned template layer (37A, 37B, 37C) is replicated within the remaining portions of the neutral polymer layer 32L and the remaining portions of the hard mask layer 31L.

Some or all of the second polymer structures 50 may be consumed during the anisotropic etch. In some embodiments, some of the patterned template layer (37A, 37B, 37C) may be consumed during the anisotropic etch. Remaining portions of the neutral polymer layer 32L are herein referred to as buffer polymer portions 32. The remaining portions of the hard mask layer 31L are herein referred to as hard mask portions 31.

Figure 6A:
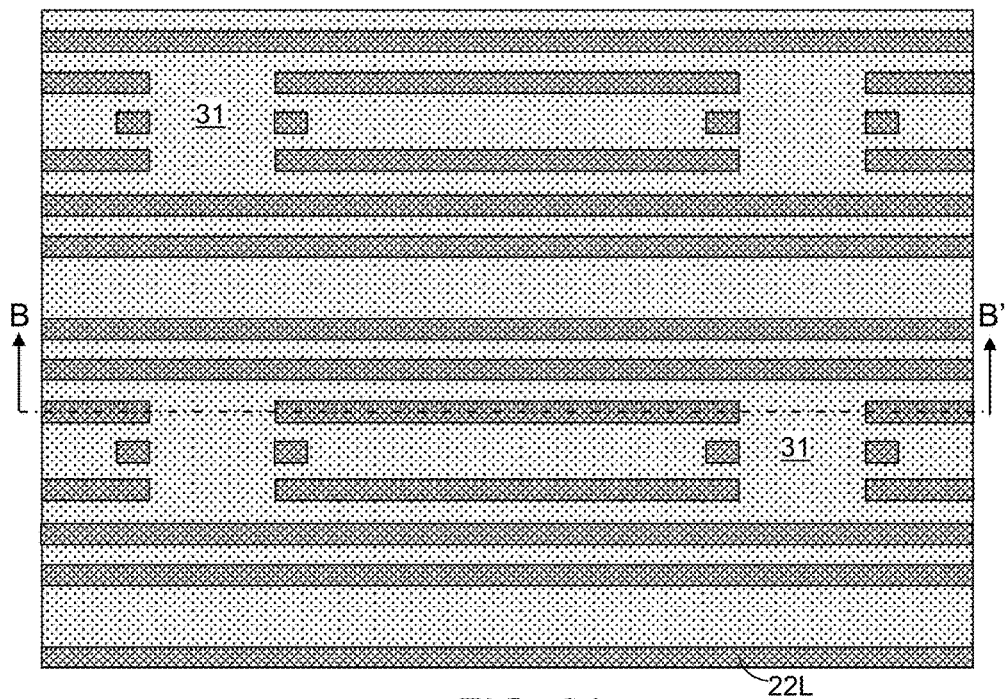
FIG. 6A is a top-down view of the first exemplary patterned structure after etching the OPL layer employing the second polymer blocks as an etch mask and removal of the second polymer blocks and the patterned template layer according to an embodiment of the present disclosure.
Figure 6B:
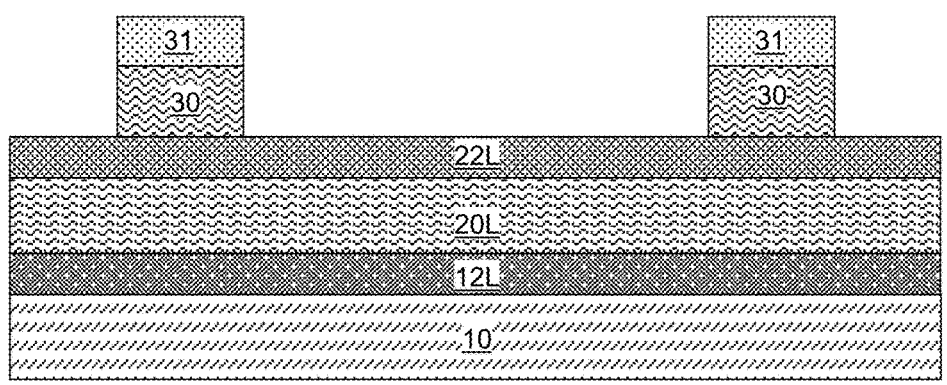
FIG. 6B is a vertical cross-sectional view of the first exemplary patterned structure along the vertical plane B-B' of FIG. 6A.

Referring to FIGS. 6A and 6B, the trench pattern is further transferred into the OPL employing the second polymer structures 50, the patterned template layer (37A, 37B, 37C), the buffer polymer portions 32, and/or the hard mask portions 31 as an etch mask. The etching of the physically exposed portions of the OPL 30L may consume the second polymer structures 50 and/or the patterned template layer (37A, 37B, 37C) and/or the buffer polymer portions 32. The chemistry of the anisotropic etch can be selected so that the material of the OPL 30L is etched, while the material of the hard mask portions 30 is not significantly etched. If any portion of the second polymer structures 50, the patterned template layer (37A, 37B, 37C), or the buffer polymer portions 32 remain above the hard mask patterns 31 after the top surface of the second material layer 22L is physically exposed, such remaining portions of the second polymer structures 50, the patterned template layer (37A, 37B, 37C), or the buffer polymer portions 32 can be removed by extending the anisotropic etch, which generally removes organic materials. In one embodiment, the hard mask portions 31 can include an inorganic dielectric material such as silicon oxide, silicon nitride, or a dielectric metal oxide in order to enable an anisotropic etch that removes organic materials selective to the hard mask portions 31.

In one embodiment, the combination of the second polymer structures 50 and the patterned template layer (37A, 37B, 37C) can be employed as an etch mask. In another embodiment, the second polymer structures 50 alone can be employed as an etch mask. The physically exposed portions of the hard mask layer 31L are etched through until the OPL 30 is physically exposed. The pattern defined by the combination of the second polymer structures 50 and the patterned template layer (37A, 37B, 37C) is replicated within the remaining portions of the neutral polymer layer 32L and the remaining portions of the hard mask layer 31L.

The remaining portions of the OPL 30L are herein referred to as a patterned OPL 30. The trenches embedded within the patterned OPL 30 replicate the trench pattern formed in the processing steps of FIGS. 4A and 4B, i.e., includes the first pattern as embodied in trenches.

Figure 7A:
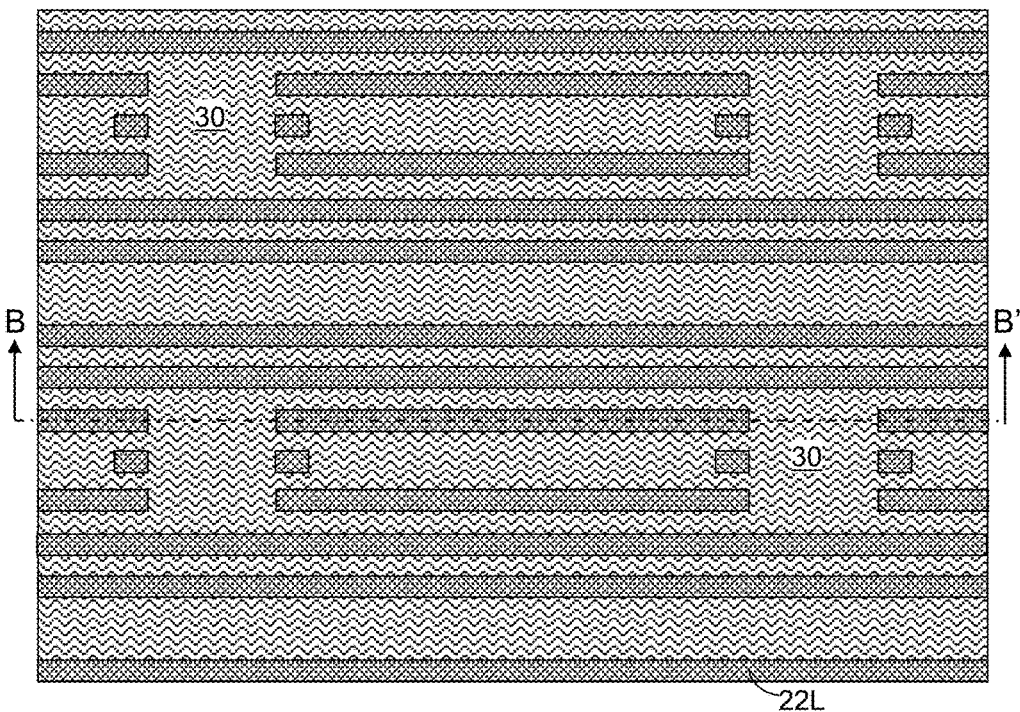
FIG. 7A is a top-down view of the first exemplary patterned structure after removal of hard mask portions of the template layer according to an embodiment of the present disclosure.
Figure 7B:
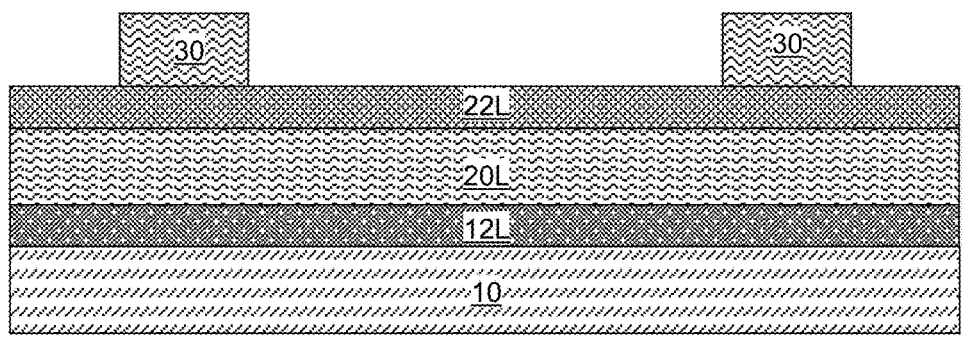
FIG. 7B is a vertical cross-sectional view of the first exemplary patterned structure along the vertical plane B-B' of FIG. 7A.

Referring to FIGS. 7A and 7B, the hard mask portions 31 are removed selective to the patterned OPL 30. The removal of the hard mask portions 31 selective to the patterned OPL may be performed, for example, by a wet etch that removes an inorganic material selective to the organic material of the patterned OPL 30. For example, if the hard mask portions 31 include silicon oxide, hydrofluoric acid may be employed to remove the hard mask portions 31 selective to the patterned OPL 30. If the hard mask portions 31 include silicon nitride, hot phosphoric acid may be employed to remove the hard mask portions 31 selective to the patterned OPL 30.

Figure 8A:
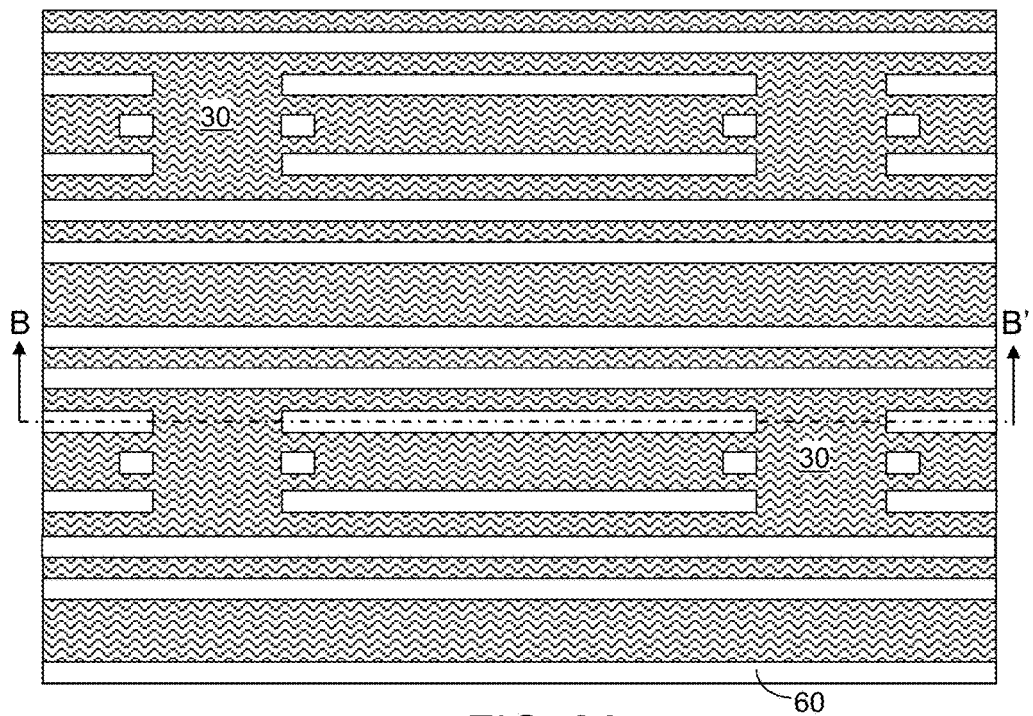
FIG. 8A is a top-down view of the first exemplary patterned structure after application of a spin-on dielectric (SOD) material and formation of a second pattern including SOD portions according to an embodiment of the present disclosure.
Figure 8B:
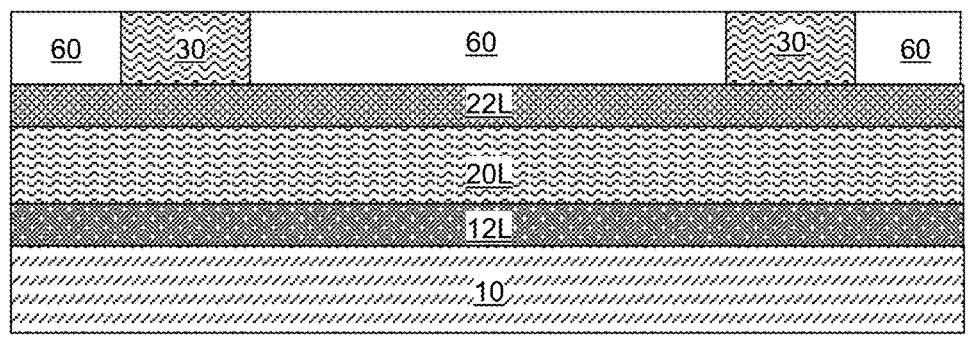
FIG. 8B is a vertical cross-sectional view of the first exemplary patterned structure along the vertical plane B-B' of FIG. 8A.

Referring to FIGS. 8A and 8B, a spin-on-dielectric (SOD) material is applied into the trenches in the stack of the patterned OPL 30 to form spin-on dielectric (SOD) portions 60. The SOD material can be any material that can be applied by spin-coating as known in the art. Thus, each SOD portion 60 is formed by filling a trench within the patterned OPL 30 with the SOD material. The SOD material can be applied to a height that does not exceed the topmost surface of the patterned OPL 30. In one embodiment, the height of the top surface of the SOD portions 60 can be coplanar with the top surface of the patterned OPL 30. In another embodiment, the height of the top surface of the SOD portions 60 can be located at a horizontal plane that is lower than the top surface of the patterned OPL 30.

The area of the SOD portions 60 is identical to the area of the first pattern, which is a trench pattern. The SOD portions 60 and the patterned OPL 30 collectively constitute a pattern-containing layer (60, 30), which includes a pattern defined by the SOD portions 60 and identical to the first pattern, and a complementary pattern that is defined by the patterned OPL 30.

In one embodiment, the SOD portion 60 can be formed by applying a liquid solution of a dielectric material in a carrier solvent. In one embodiment, the SOD portion 60 can include a material selected from hydrogen silsesquioxane and methyl-silsesquioxane and dissolved in the carrier solvent. In one embodiment, the SOD portion 60 can be formed by applying a liquid solution of a polymeric material in a carrier solvent. For example, the SOD portion 60 can be formed by applying a liquid solution of a thermally-curable material selected from polysilazane, polyimide, polynorbornenes, benzocyclobutene, and polytetrafluoroethylene (PTFE) in the carrier solvent.

The SOD portions 60 are cured, for example, by annealing at an elevated temperature at which a predominant portion of the carrier solvent evaporates. The temperature and the duration of the anneal for curing the SOD portions 60 can be selected such that at least 95% of the carrier solvent is evaporated. Thus, after the curing of the SOD portions 60, the SOD portions include a cured spin-on dielectric material. Alternately, the curing of the SOD portions 60 can be performed by employing alternate curing methods such as an oxygen plasma cure, an ultraviolet cure, and a combination of at least two of an oxygen plasma cure, ultraviolet cure, and a thermal cure.

The curing of the SOD portions 60 typically causes the volume of each SOD portion to shrink, for example, by a percentage in a range from 5% to 20%. Thus, the top surfaces of the SOD portions 60 become recessed relative to the top surface of the patterned OPL 30. Thus, the topmost surfaces of the SOD portions 60 are located below the plane of the top surface of the patterned OPL 30 after curing.

In one embodiment, a residual amount of the carrier solvent can remain in the SOD portions 60 after the curing step. In this case, the cured spin-on dielectric material of the SOD portions 60 can include an organic solvent at an atomic concentration of at least 0.01%.

In one embodiment, the SOD material can be a spin-on glass (SOG) material. In this case, the cured spin-on dielectric material includes $SiO_x$, in which x is in a range from 1.25 to 1.75.

In one embodiment, the cured spin-on dielectric material of the SOD portions 60 can include carbon at an atomic concentration of at least 0.5%, which can be due to residual carbon-containing polymers.

In one embodiment, the cured spin-on dielectric material can include an organic polymeric material. For example, the cured spin-on dielectric material can include a material selected from polysilazane, polyimide, polynorbornenes, benzocyclobutene, and polytetrafluoroethylene (PTFE).

Figure 9A:
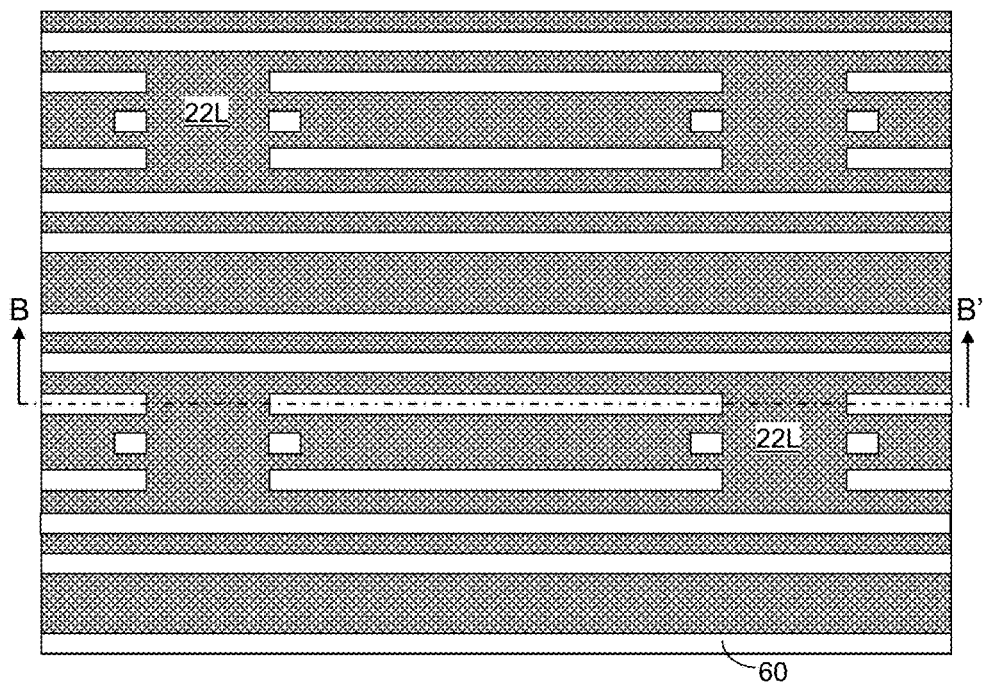
FIG. 9A is a top-down view of the first exemplary patterned structure after removal of remaining portions of the OPL and formation of a second pattern that replicates the first pattern with protruding structures according to an embodiment of the present disclosure.
Figure 9B:
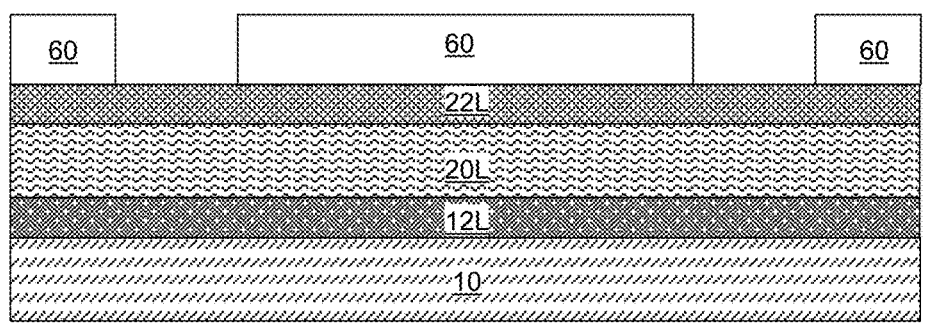
FIG. 9B is a vertical cross-sectional view of the first exemplary patterned structure along the vertical plane B-B' of FIG. 9A.

Referring to FIGS. 9A and 9B, remaining portions of the patterned OPL 30 are removed employing the SOD portions 60 as an etch mask. The SOD portions 60 define a second pattern that embodied a set of vertically protruding structures and having identical shapes as the trench pattern. The second pattern is a line pattern, i.e., a pattern defined by a set of protruding structures, and has identical shapes as the first pattern, which is a trench pattern defined by a set of trenches (recessed regions). The processing steps of FIGS. 8A, 8b, 9A, and 9B invert the trench pattern to form the line pattern including identical shapes as the trench pattern, which is herein referred to as a tone inversion. During the tone inversion, the complementary pattern of the first pattern defined by a set of protruding structures at the processing steps of FIGS. 4A and 4B (such as the second block structures 50), by a set of protruding structures at the processing steps of FIGS. 5A and 5B (such as the buffer polymer portions 32 and the hard mask portions 31), by a set of protruding structures at the processing steps of FIGS. 6A and 6B (such as the hard mask portions 31 and the patterned OPL 30), or by the protruding structures at the processing steps of FIGS. 7A and 7B (such as the patterned OPL 30) is inverted into a complementary pattern of the second pattern at the processing steps of FIGS. 9A and 9B. The complementary pattern of the second pattern is defined by the trenches embedded within the SOD portions 60.

Figure 10A:
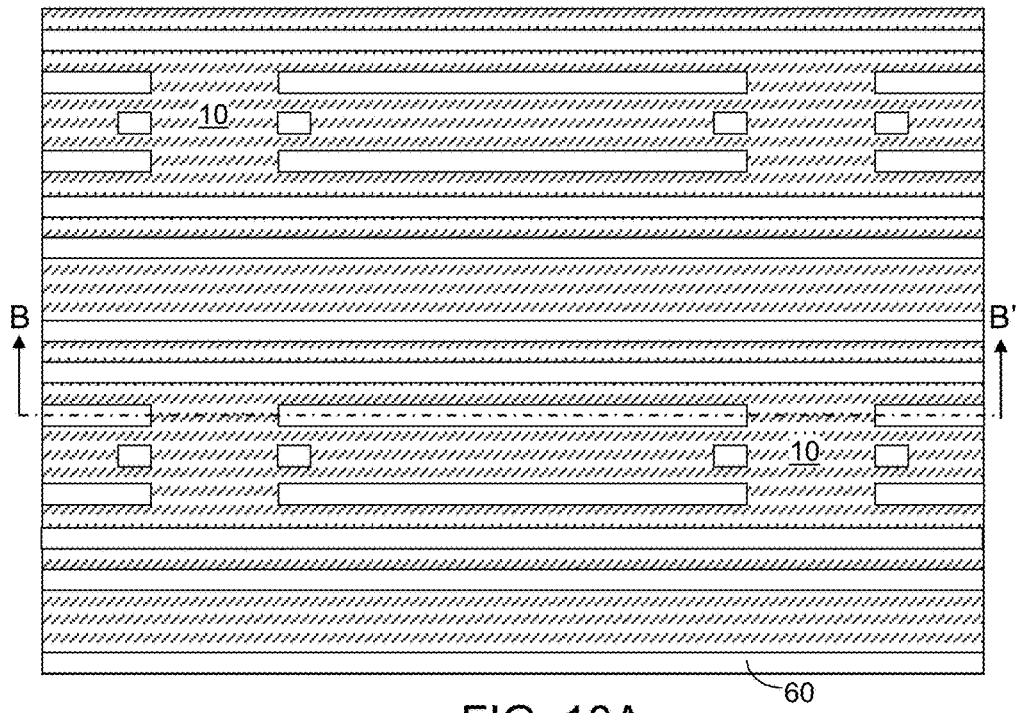
FIG. 10A is a top-down view of the first exemplary patterned structure after transfer of the second pattern into through the second material layer, the underlying OPL, and the first material layer by an anisotropic etch according to an embodiment of the present disclosure.
Figure 10B:
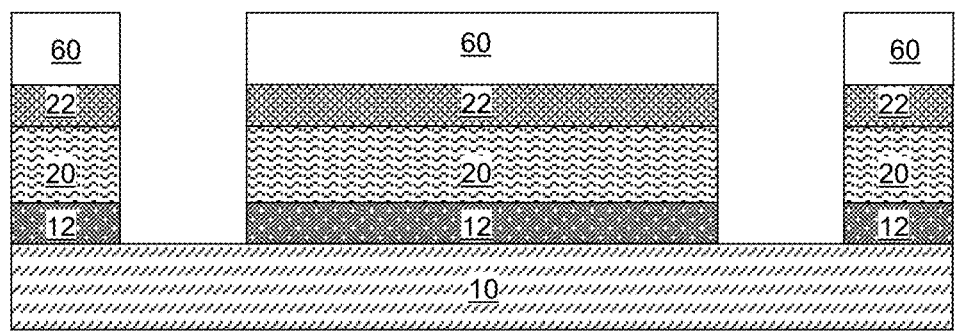
FIG. 10B is a vertical cross-sectional view of the first exemplary patterned structure along the vertical plane B-B' of FIG. 10A.

Referring to FIGS. 10A and 10B, the second pattern present in the SOD portions 60 can be subsequently transferred into underlying material layers. For example, the second pattern can be transferred into the second material layer 22L employing the SOD portions 60 as an etch mask. The remaining portions of the second material layer 22L constitute second material portions 22 that replicate the second pattern. Some, all, or none, of the SOD portions 60 may be consumed during the anisotropic etch that transfers the second pattern into the second material portions 22.

In one embodiment, the second material layer 22L can be a dielectric hard mask layer including a dielectric material such as silicon oxide, silicon nitride, silicon oxynitride, or a combination thereof. In this case, the second material portions 22 can function as a hard mask for subsequent anisotropic etches to be employed to further transfer the second pattern to layers located underneath the second material portions 22.

The second pattern can be transferred into the underlying OPL 20L and the first material layer 12L. Remaining portions of the underlying OPL 20L constitute underlying OPL portions 20, and remaining portions of the first material layer 12L constitute second material portions 12. The underlying OPL portions 20 have the second pattern, and the first material portions 12 have the second pattern. The second material portions 22 may be removed during, or after, the transfer of the second pattern into the first material portions 12.

Figure 11A:
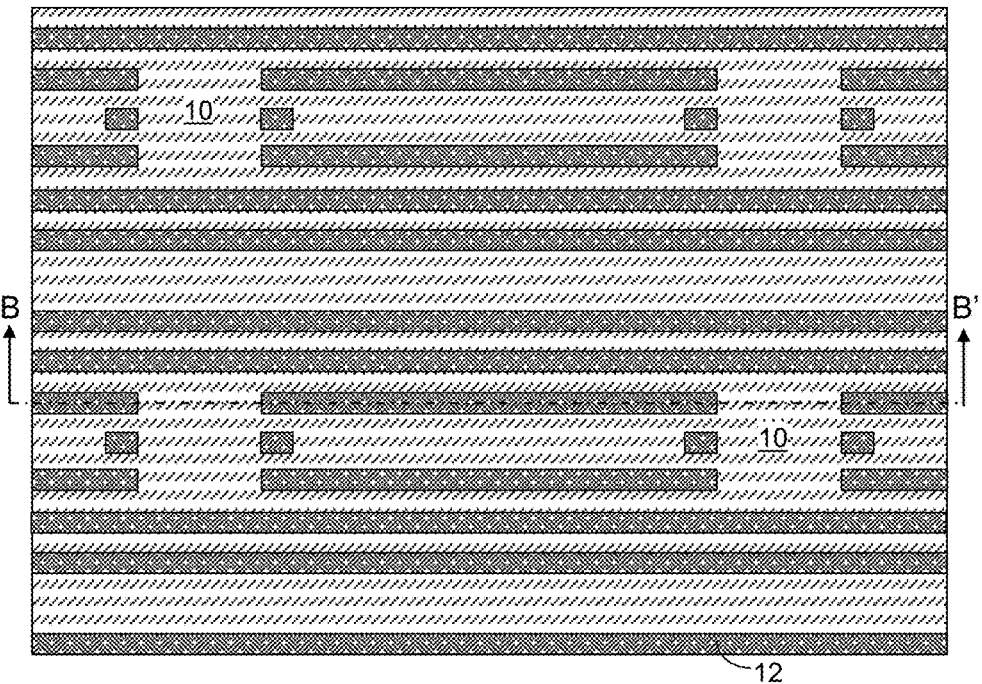
FIG. 11A is a top-down view of the first exemplary patterned structure after transfer of the second pattern into an upper portion of the substrate according to an embodiment of the present disclosure.
Figure 11B:
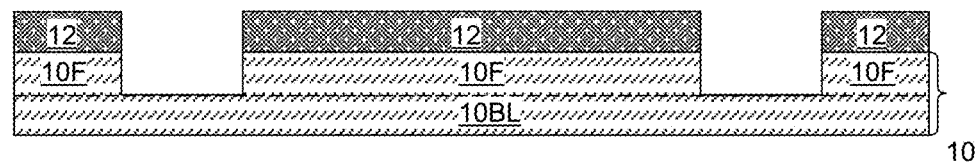
FIG. 11B is a vertical cross-sectional view of the first exemplary patterned structure along the vertical plane B-B' of FIG. 11A.

Referring to FIGS. 11A and 11B, the second pattern is transferred into an upper portion of the substrate 10 by an anisotropic etch. Patterned upper portions of the substrate 10 can constitute fin structures 10F, which can be semiconductor fins if the upper portion of the substrate 10 includes a semiconductor material. The SOD portions 60 and the second material portions 22 may be removed during the anisotropic etch that transfers the first pattern into the upper portion of the substrate 10 and/or in subsequent etch steps, i.e., by at least one wet etch, by at least one dry etch, or by a combination of at least one wet etch and at least one dry etch. In one embodiment, the first material portions 12 can be permanent structures that are not subsequently removed. In this case, the underlying OPL portions 20 can be removed selective to the first material portion 12. In another embodiment, the second material portion 12 can be temporary structures that are removed after transfer of the second pattern into an upper portion of the substrate 10.

If the substrate 10 is a bulk semiconductor substrate, a lower portion of the substrate 10 underlying the fin structures 10F can be a bulk semiconductor layer 10BL.

Figure 12:
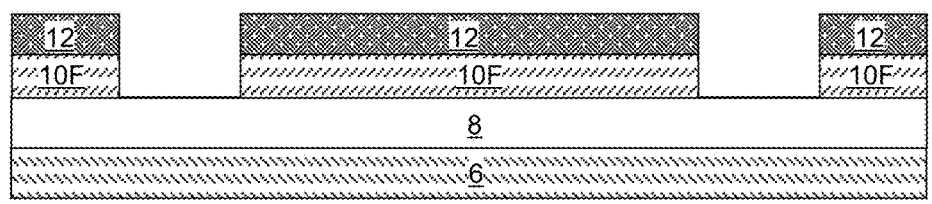
FIG. 12 is a top-down view of a second exemplary patterned structure after transfer of a second pattern through a top semiconductor layer of a semiconductor-on-insulator (SOI) substrate according to an embodiment of the present disclosure.

Referring to FIG. 12, a second exemplary patterned structure according to an embodiment of the present disclosure is shown, which employs a semiconductor-on-insulator (SOI) substrate including a handle substrate 6, a buried insulator layer 8, and a top semiconductor layer in lieu of the substrate 10 of the first exemplary patterned structure. At processing steps corresponding to FIGS. 11A and 11B, an anisotropic etch is employed to transfer the second pattern through the top semiconductor layer. The remaining portions of the top semiconductor layer constitutes the fin structures 10F, which are semiconductor fin structures including a semiconductor material. The buried insulator layer 8 can function as an etch stop layer during the patterning of the fin structures 10F by the anisotropic etch.

Figure 13A:
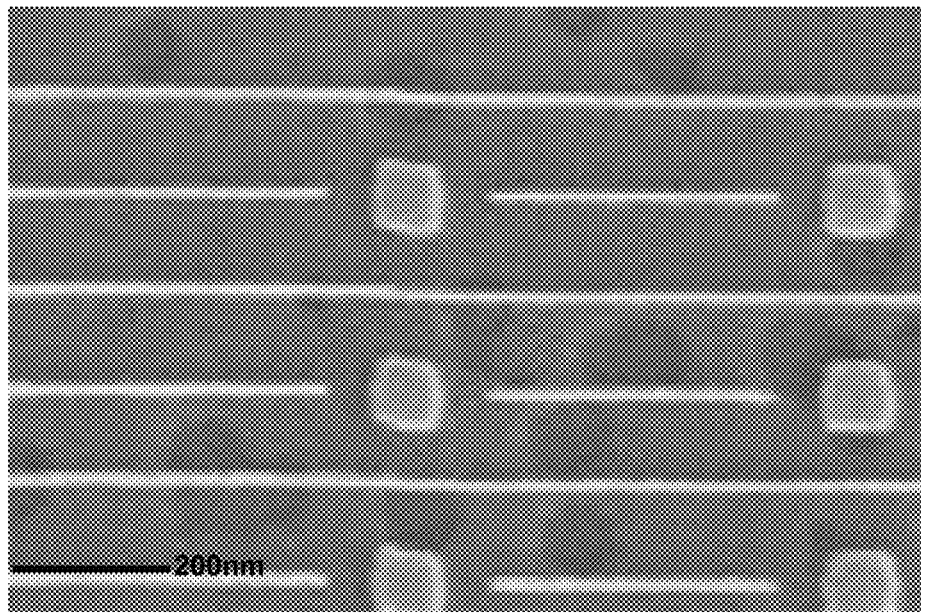
FIG. 13A is a scanning electron micrograph (SEM) of a sample prepared employing methods of the present disclosure up to the processing steps of FIGS. 1A and 1B.
Figure 13B:
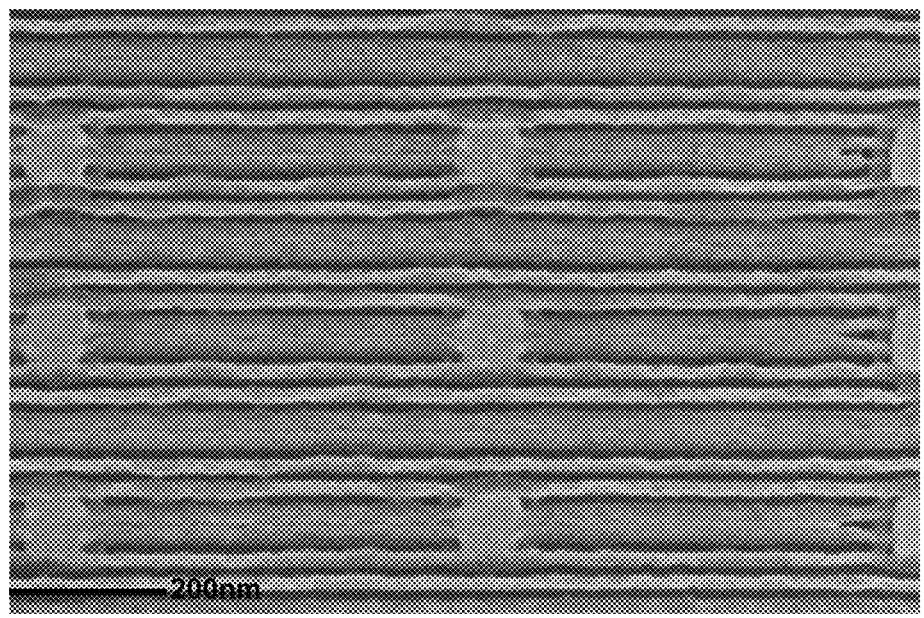
FIG. 13B is an SEM of a sample prepared employing methods of the present disclosure up to the processing steps of FIGS. 6A and 6B.
Figure 13C:
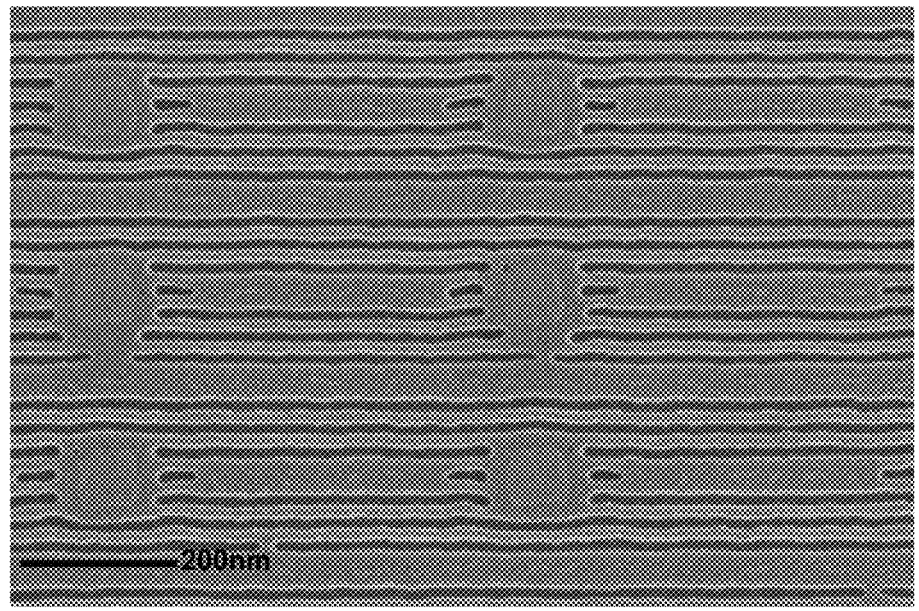
FIG. 13C is an SEM of a sample prepared employing methods of the present disclosure up to the processing steps of FIGS. 7A and 7B.
Figure 13D:
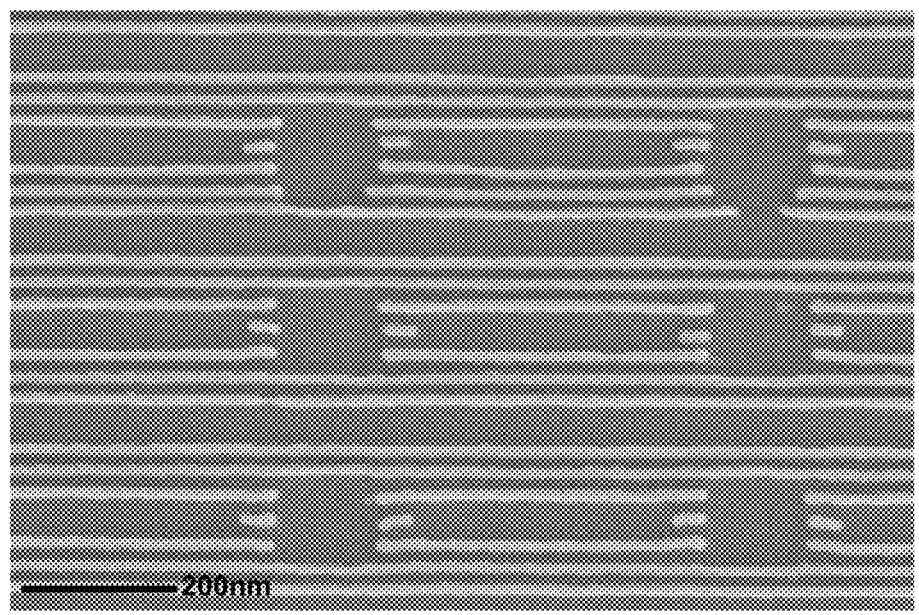
FIG. 13D is an SEM of a sample prepared employing methods of the second embodiment of the present disclosure up to the processing steps of FIG. 12.

Referring to FIGS. 13A-13D, scanning electron micrographs (SEM's) of a sample prepared employing a second embodiment of the present disclosure are shown. FIG. 13A corresponds to the processing steps of FIGS. 1A and 1B. The bright regions in FIG. 13A are regions of the patterned template layer (37A, 37B, 37C). FIG. 13B corresponds to the processing steps of FIGS. 6A and 6B. The bright regions in FIG. 13B are regions corresponding the hard mask portions 31. FIG. 13C corresponds to the processing steps of FIGS. 7A and 7B. The bright regions in FIG. 13C are regions corresponding to the patterned OPL 30. FIG. 13D corresponds to the processing steps of FIG. 12. The bright regions in FIG. 13D are regions corresponding to the fin structures 10F, which are semiconductor fins.

Figure 14A:
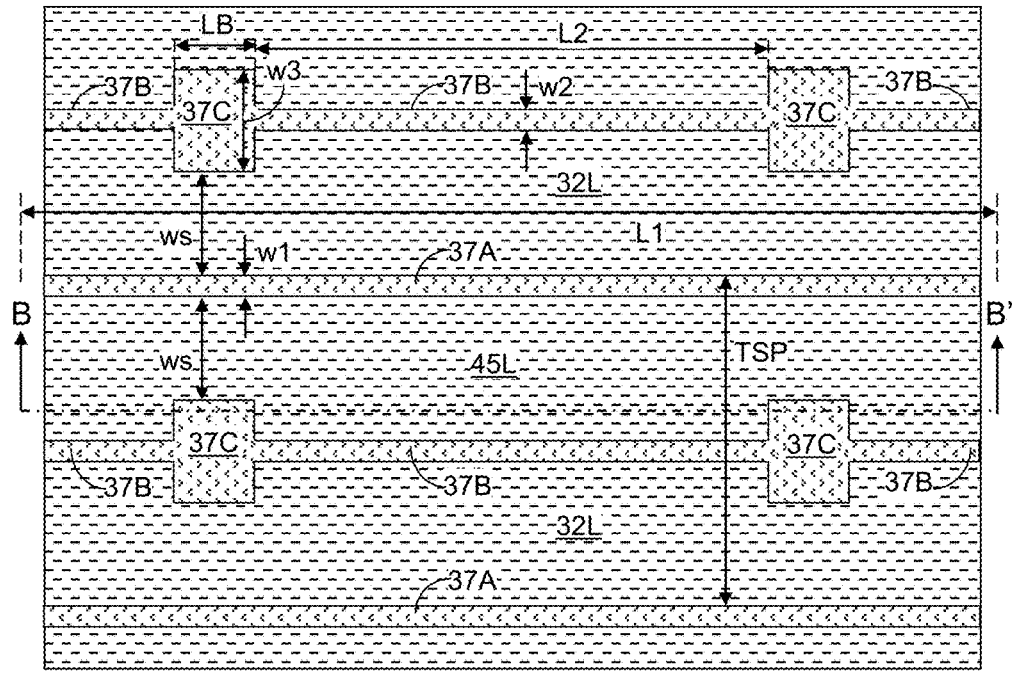
FIG. 14A is a top-down view of a third exemplary patterned structure after formation of a material stack of a first material layer, an underlying organic planarization layer (OPL), a second material layer, an organic planarization layer (OPL), a hard mask layer, a neutral polymer layer, and a patterned template layer over a substrate according to an embodiment of the present disclosure.
Figure 14B:
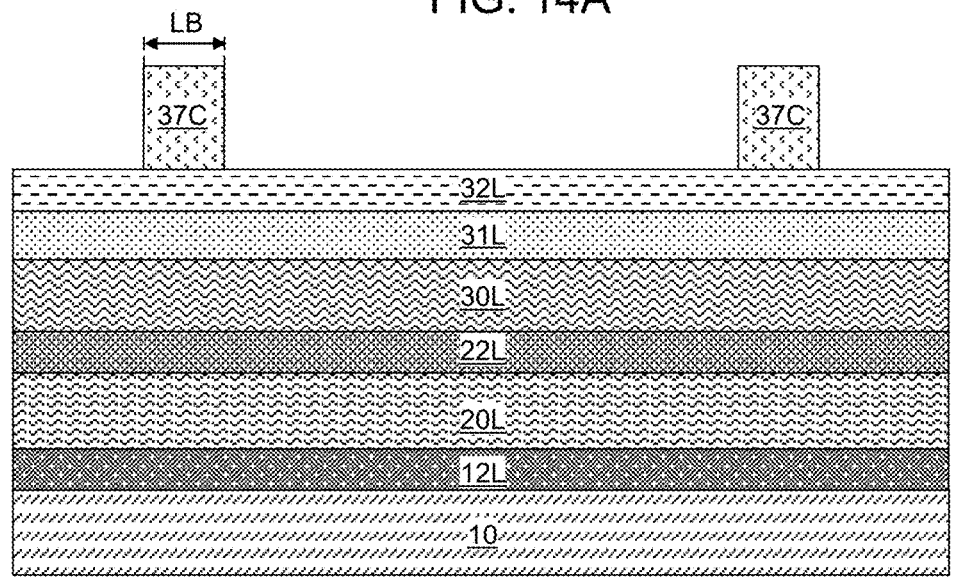
FIG. 14B is a vertical cross-sectional view of the third exemplary patterned structure along the vertical plane B-B' of FIG. 14A.

Referring to FIGS. 14A and 14B, a third exemplary patterned structure according to an embodiment of the present disclosure can be derived from the first exemplary patterned structure illustrated in FIGS. 1A and 1B by altering the pattern of the patterned template layer (37A, 37B, 37C). Specifically, the pattern of the patterned template layer (37A, 37B, 37C) is altered such that each of at least one second linear portion 37B adjoins one or two of the at least one first linear portion 37A. In other words, the lengthwise-direction spacing is is changed to zero.

Figure 15A:
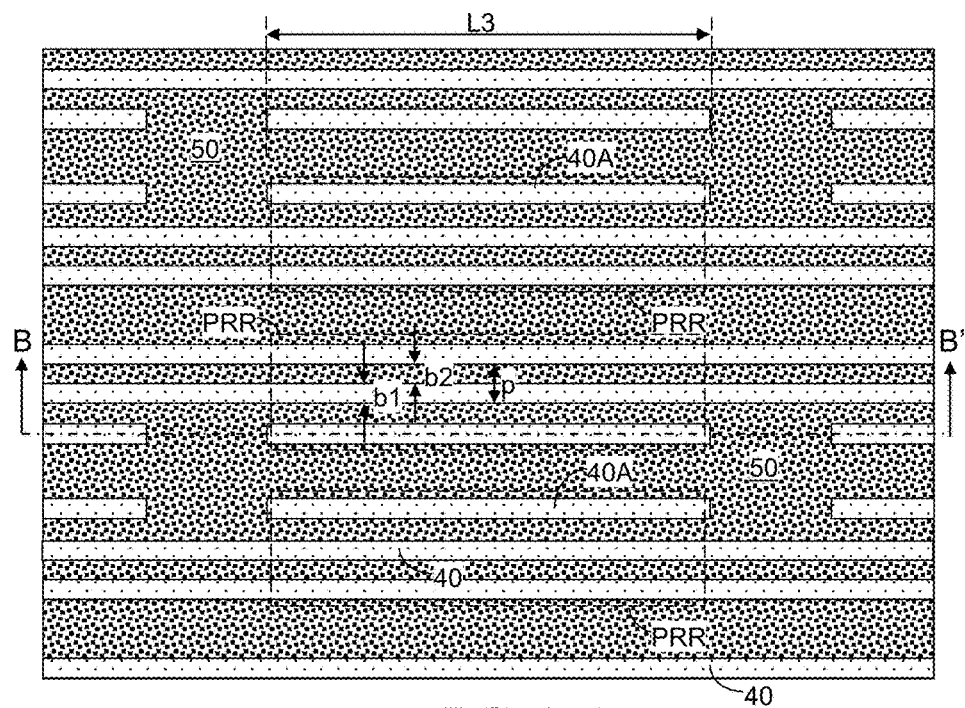
FIG. 15A is a top-down view of the third exemplary patterned structure after phase separation of the copolymer material in the copolymer layer according to an embodiment of the present disclosure.
Figure 15B:
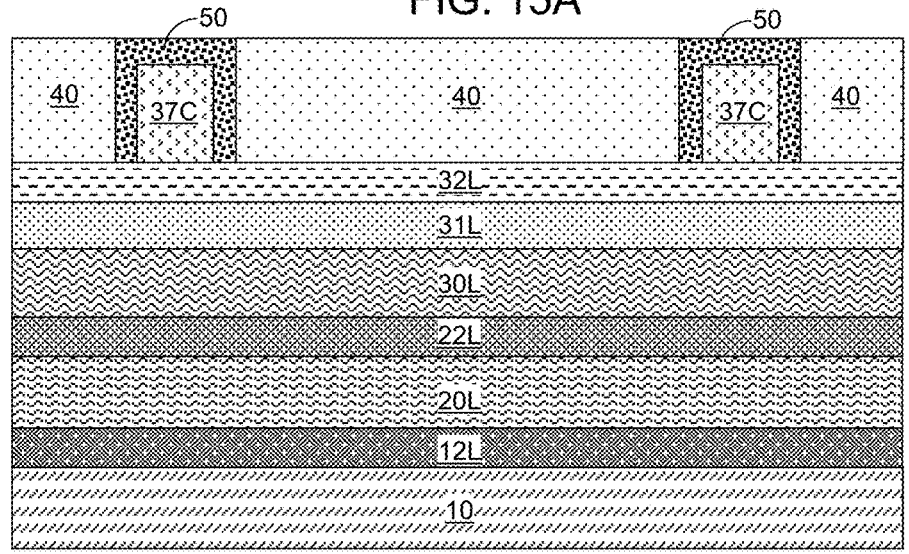
FIG. 15B is a vertical cross-sectional view of the third exemplary patterned structure along the vertical plane B-B' of FIG. 15A.

Referring to FIGS. 15A and 15B, the processing steps of FIGS. 2A, 2B, 3A, and 3B of the first embodiment can be subsequently performed. Formation of isolated first polymer structures 40B, which are formed in the first exemplary patterned structure, can be suppressed due to the changes in the pattern of the patterned template layer (37A, 37B, 37C) in the third embodiment.

Figure 16A:
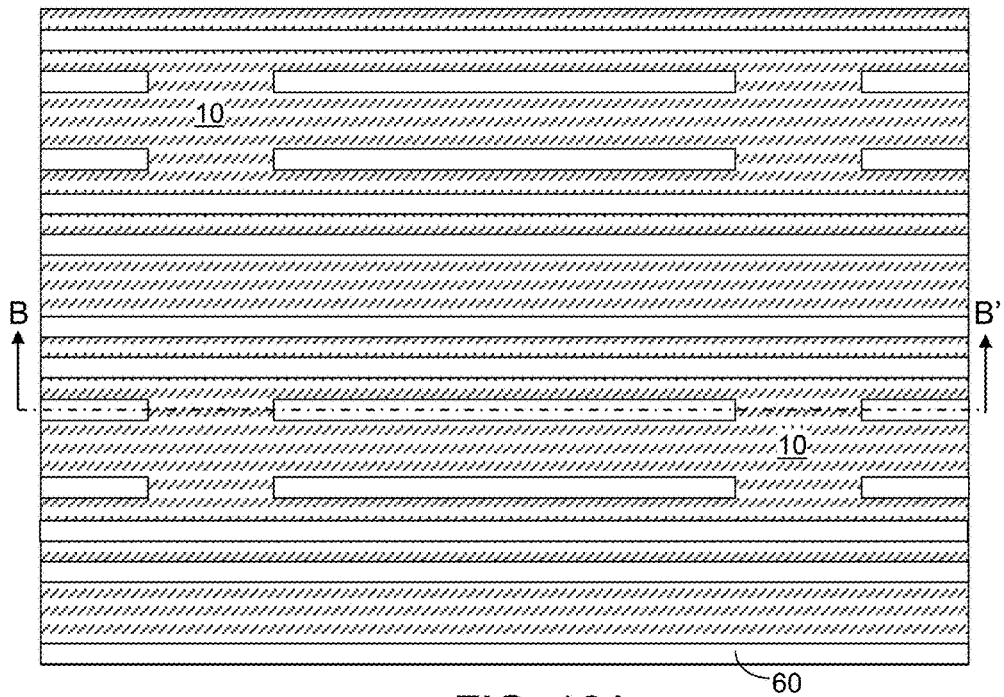
FIG. 16A is a top-down view of the third exemplary patterned structure after transfer of the second pattern into through the second material layer, the underlying OPL, and the first material layer by an anisotropic etch according to an embodiment of the present disclosure.
Figure 16B:
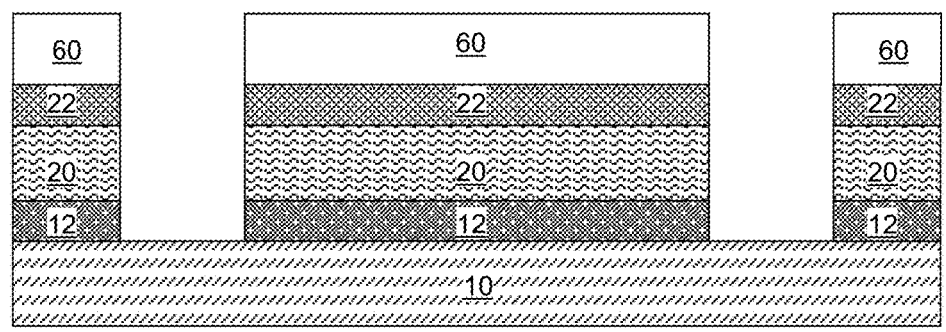
FIG. 16B is a vertical cross-sectional view of the third exemplary patterned structure along the vertical plane B-B' of FIG. 16A.

Referring to FIGS. 16A and 16B, the processing steps of FIGS. 4A, 4B, 5A, 5B, 6A, 6B, 7A, 7B, 8A, 8B, 9A, 9B, 10A, and 10B can be subsequently performed. Because isolated first polymer structures 40B are not formed at the processing steps of FIGS. 15A and 15B, isolated vertical stacks of a first material portion 12, an underlying OPL portion 20, a second material portion 22, and an SOD portion 60, which are formed in the first exemplary patterned structure of FIGS. 10A and 10B, are not formed in the third exemplary patterned structure.

Figure 17A:
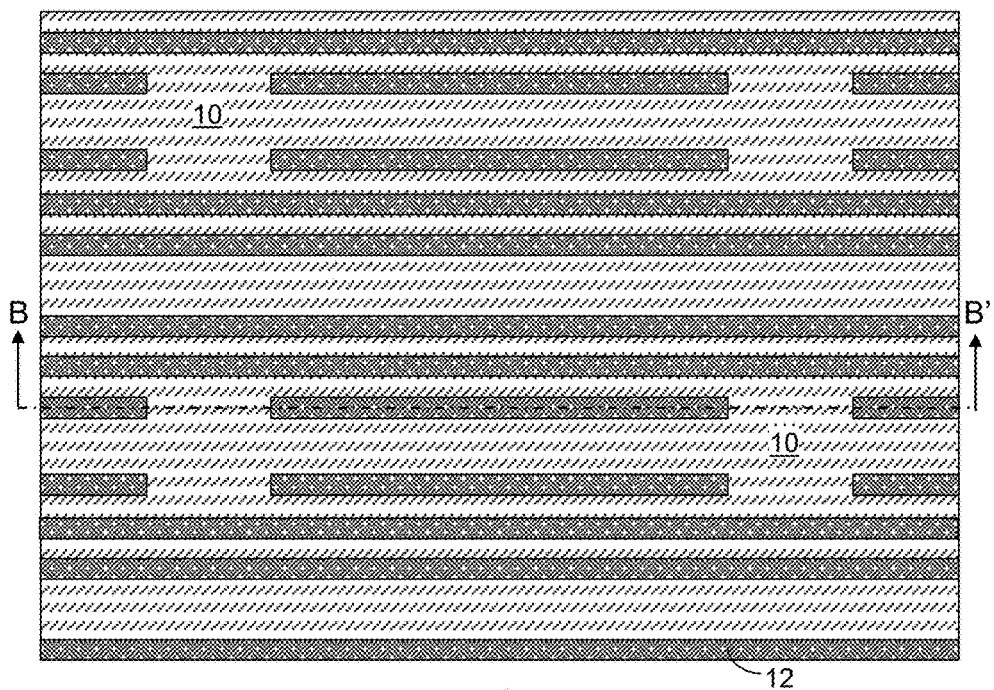
FIG. 17A is a top-down view of the third exemplary patterned structure after transfer of the second pattern into an upper portion of the substrate according to an embodiment of the present disclosure.
Figure 17B:
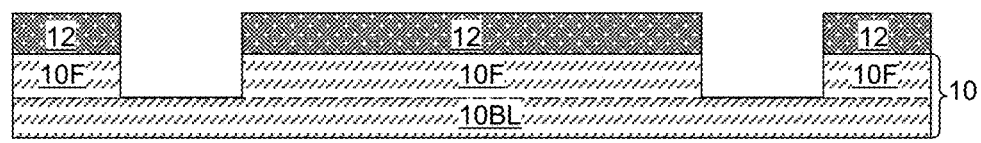
FIG. 17B is a vertical cross-sectional view of the third exemplary patterned structure along the vertical plane B-B' of FIG. 17A.

Referring to FIGS. 17A and 17B, the processing steps of FIGS. 11A and 11B are performed.

Figure 18:
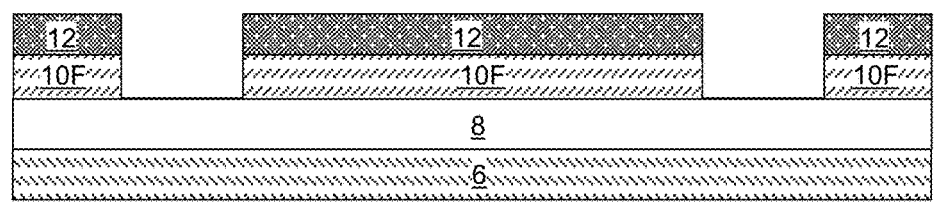
FIG. 18 is a top-down view of a fourth exemplary patterned structure after transfer of a second pattern through a top semiconductor layer of a semiconductor-on-insulator (SOI) substrate according to an embodiment of the present disclosure.

Referring to FIG. 18, a fourth exemplary patterned structure according to an embodiment of the present disclosure is shown, which employs a semiconductor-on-insulator (SOI) substrate including a handle substrate 6, a buried insulator layer 8, and a top semiconductor layer in lieu of the substrate 10 of the first exemplary patterned structure. At processing steps corresponding to FIGS. 17A and 17B, an anisotropic etch is employed to transfer the second pattern through the top semiconductor layer. The remaining portions of the top semiconductor layer constitutes the fin structures 10F, which are semiconductor fin structures including a semiconductor material. The buried insulator layer 8 can function as an etch stop layer during the patterning of the fin structures 10F by the anisotropic etch.

Figure 19A:
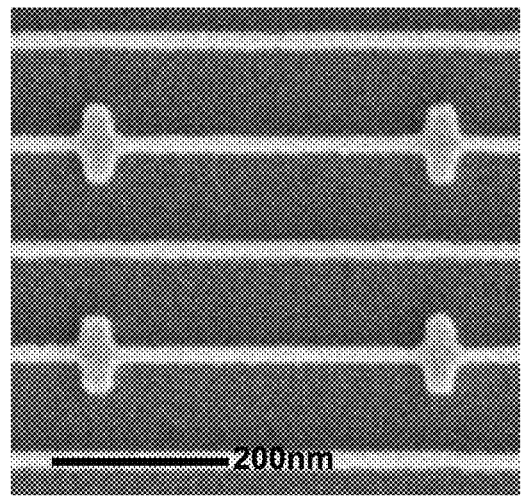
FIG. 19A is a scanning electron micrograph (SEM) of another sample prepared employing methods of the present disclosure up to the processing steps of FIGS. 14A and 14B.
Figure 19B:
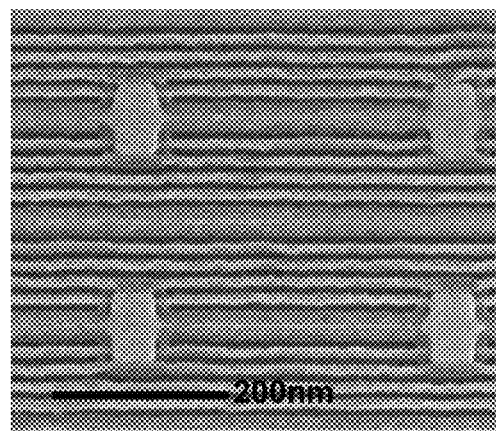
FIG. 19B is an SEM of another sample prepared employing methods of the present disclosure up to the processing steps of FIGS. 6A and 6B.
Figure 19C:
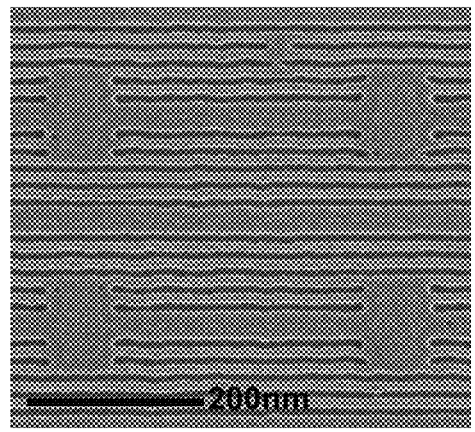
FIG. 19C is an SEM of another sample prepared employing methods of the present disclosure up to the processing steps of FIGS. 7A and 7B.
Figure 19D:
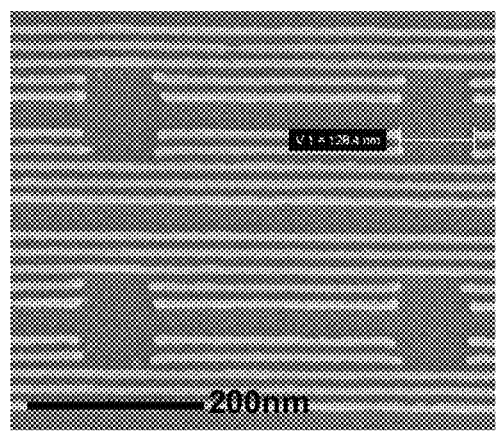
FIG. 19D is an SEM of a sample prepared employing methods of the second embodiment of the present disclosure up to the processing steps of FIG. 18.

Referring to FIGS. 19A-19D, scanning electron micrographs (SEM's) of another sample prepared employing a fourth embodiment of the present disclosure are shown. FIG. 19A corresponds to the processing steps of FIGS. 14A and 14B. The bright regions in FIG. 19A are regions of the patterned template layer (37A, 37B, 37C). FIG. 19B corresponds to the processing steps of FIGS. 6A and 6B. The bright regions in FIG. 19B are regions corresponding the hard mask portions 31. FIG. 19C corresponds to the processing steps of FIGS. 7A and 7B. The bright regions in FIG. 19C are regions corresponding to the patterned OPL 30. FIG. 19D corresponds to the processing steps of FIG. 18. The bright regions in FIG. 19D are regions corresponding to the fin structures 10F, which are semiconductor fins.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method of forming a patterned structure comprising:
   providing a template layer over a substrate;
   patterning said template layer to form a patterned template layer over said substrate, said patterned template layer containing a first linear portion extending along a lengthwise direction and having a first length, a second linear portion that is parallel to said first linear portion and having a second length that is less than said first length and having a uniform width, and blocking template structures having a blocking template structure width that is greater than said uniform width;
   applying a block copolymer material over said substrate and on said patterned template layer, wherein said block copolymer material includes alternating chains of a first polymeric block and a second polymeric block, said first polymeric block including a chain of a first polymeric block component and a second polymeric block including a chain of a second polymeric block component;
   inducing self-assembly of polymeric block components within said block copolymer material employing said patterned template layer as a template for alignment, wherein a polymeric block component portion parallel to said first and second linear portions, having a third length that is less than said second length, and having another uniform width is formed between a pair of blocking template structures among said blocking template; and
   removing said first polymeric block component selective to said second polymeric block component, wherein a trench pattern defined by trenches embedded within said second polymeric block component is formed.

2. The method of claim 1, wherein said uniform width of said second linear portion is substantially the same as a total length of said first polymeric block.

3. The method of claim 2, wherein said another uniform width of said block component portion is said total length of said first polymeric block.

4. The method of claim 1, wherein said second linear portion is adjoined to two of said blocking template structures.

5. The method of claim 4, wherein said blocking template structures are spaced from said second linear portion with a lengthwise-direction spacing that is greater than said pitch.

6. The method of claim 5, wherein said lengthwise-direction spacing is a sum of said pitch and said total length of said second polymeric block.

7. The method of claim 4, wherein said blocking template structures are spaced from said first linear portion with a widthwise-direction spacing that is greater than said pitch.

8. The method of claim 7, wherein said widthwise-direction spacing is a sum of said total length of said second polymeric block and an integer multiple of said pitch.

9. The method of claim 8, wherein said integer multiple of said pitch is twice said pitch.

10. The method of claim 4, wherein said blocking template structure width is greater than said pitch of said block copolymer material.

11. The method of claim 10, wherein said blocking template structure width is a sum of said total length of said first polymeric block and an integer multiple of said pitch.

12. The method of claim 11, wherein said integer multiple of said pitch is twice said pitch.

13. The method of claim 1, wherein said blocking template structure width is greater than a pitch of said block copolymer material, said pitch being a sum of a total length of said first polymeric block and a total length of said second polymeric block.

14. The method of claim 13, wherein said first linear portion and said second linear portion are formed with a widthwise-direction spacing from each other that is greater than said pitch of said block copolymer material.

15. The method of claim 13, wherein a center-to-center distance between said first linear portion and said second linear portion in a direction perpendicular to said lengthwise direction is an integer multiple of said pitch.

16. The method of claim 15, wherein said integer is greater than 1 and is less than 11.

17. The method of claim 1, wherein said polymeric block component portion comprises said first polymeric block component and is laterally surrounded by said second polymeric block component.

18. The method of claim 1, wherein said substrate includes a material stack formed on a semiconductor substrate, and wherein said method further comprises;
transferring said trench pattern into an upper portion of said material stack by an anisotropic etch employing said second polymeric block component as an etch mask.

19. The method of claim 18, further comprising:
inverting said trench pattern to form a line pattern comprising a set of vertically protruding structures and having identical shapes as said trench pattern; and
transferring said line pattern into an upper portion of said semiconductor substrate.

20. The method of claim 19, wherein said semiconductor substrate comprises a vertical stack of an insulator layer and a semiconductor material layer, and said method further comprises transferring said line pattern into said semiconductor material layer to provide semiconductor fins, wherein said semiconductor fins contact a top surface of said insulator layer.

21. The method of claim 18, wherein said material stack comprises, from bottom to top, an organic planarization layer (OPL), a hard mask layer, and a neutral polymer layer, and wherein said trench pattern is transferred into said OPL.

22. The method of claim 21, further comprising:
filling trenches within said OPL with spin-on-dielectric (SOD) portions comprising a SOD material;
removing remaining portions of said OPL employing said SOD portions as an etch mask, wherein said SOD portions define a line pattern comprising a set of vertically protruding structures and having identical shapes as said trench pattern; and
transferring said line pattern into an upper portion of said substrate, wherein fin structures are formed in said upper portion of said substrate.

23. The method of claim 1, wherein said patterned template layer comprises hydrogen silsesquioxane (HSQ) or methyl silsesquioxane (MSQ).

* * * * *